(12) United States Patent
Madurawe et al.

(10) Patent No.: US 6,646,919 B1
(45) Date of Patent: Nov. 11, 2003

(54) APPARATUS AND METHOD FOR MARGIN TESTING SINGLE POLYSILICON EEPROM CELLS

(75) Inventors: Raminda U. Madurawe, Sunnyvale, CA (US); Myron W. Wong, San Jose, CA (US); John C. Costello, San Jose, CA (US); James D. Sansbury, Portola Valley, CA (US); Bruce F. Mielke, Los Altos Hills, CA (US)

(73) Assignee: Altera Corporation, San Jose, CA (US)

(*) Notice: Subject to any disclaimer, the term of this patent is extended or adjusted under 35 U.S.C. 154(b) by 108 days.

(21) Appl. No.: 09/874,716

(22) Filed: Jun. 4, 2001

Related U.S. Application Data

(62) Division of application No. 08/995,873, filed on Dec. 22, 1997, now Pat. No. 6,268,623.
(60) Provisional application No. 60/041,026, filed on Mar. 20, 1997.

(51) Int. Cl.[7] .......................... G11C 16/06; G11C 16/04
(52) U.S. Cl. .......................... 365/185.21; 365/185.29; 365/185.22; 365/185.24; 365/185.26; 365/185.18
(58) Field of Search ................. 365/185.29, 185.21, 365/185.22, 185.24, 185.26, 185.18

(56) References Cited

U.S. PATENT DOCUMENTS

| | | | |
|---|---|---|---|
| 4,612,630 A | * 9/1986 | Rosier | 365/201 |
| 5,313,427 A | * 5/1994 | Schreck et al. | 365/218 |
| 5,331,590 A | 7/1994 | Josephson et al. | |
| 5,400,286 A | * 3/1995 | Chu et al. | 365/185.19 |
| 5,513,193 A | * 4/1996 | Hashimoto | 714/804 |
| 5,537,356 A | * 7/1996 | Akaogi et al. | 365/205 |
| 5,537,362 A | * 7/1996 | Gill et al. | 365/233.5 |
| 5,625,211 A | 4/1997 | Kowshik | |
| 5,657,332 A | * 8/1997 | Auclair et al. | 714/763 |
| 5,742,542 A | 4/1998 | Lin et al. | |
| 5,761,116 A | 6/1998 | Li et al. | |
| 5,764,569 A | 6/1998 | Wright | |
| 5,825,782 A | * 10/1998 | Roohparvar | 714/718 |
| 5,841,165 A | 11/1998 | Chang et al. | |
| 5,905,675 A | 5/1999 | Madurawe et al. | |
| 5,942,780 A | 8/1999 | Barsan et al. | |
| 6,049,899 A | * 4/2000 | Auclair et al. | 714/721 |
| 6,067,598 A | * 5/2000 | Roohparvar et al. | 711/103 |
| 6,122,209 A | * 9/2000 | Pass et al. | 365/201 |
| 6,252,273 B1 | * 6/2001 | Salter et al. | 257/316 |
| 6,317,364 B1 | * 11/2001 | Guterman et al. | 365/185.28 |

FOREIGN PATENT DOCUMENTS

EP        0 582 319 A        2/1994

* cited by examiner

Primary Examiner—Hoai Ho
Assistant Examiner—Ly Duy Pham
(74) Attorney, Agent, or Firm—Beyer Weaver & Thomas LLP

(57) ABSTRACT

Disclosed is a method and apparatus for evaluating margin voltages in single poly EEPROM cells. Briefly, the invention involves shifting the cell's threshold voltage higher, resulting in a corresponding rise in the margin voltage, so that testing for the erase margin may be conducted in the positive voltage range. The present invention implements a variety of solutions to the problem, including both innovations in cell processing and circuitry. In one embodiment, the process steps employed to create the floating gate transistor are changed in order to increase its threshold voltage. Alternatively, or in combination with these general process changes, the width of the floating gate transistor may be reduced, resulting in a corresponding increase in the margin voltage. Circuit modifications include providing a separate test mode condition where the sense amp trip current is higher than under normal operation, and raising the source line's voltage level with a new sense amp optimization, or only during the margin testing mode, both of which shift the erase margin voltages for the cell into the testable range.

9 Claims, 14 Drawing Sheets

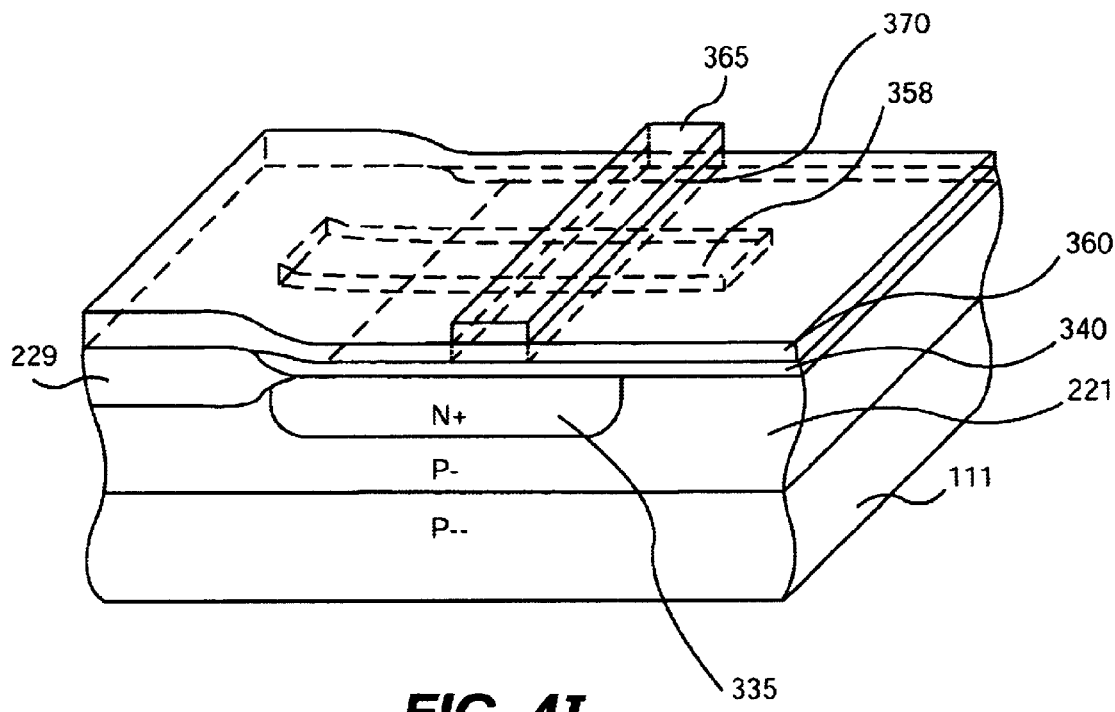
FIG. 4I
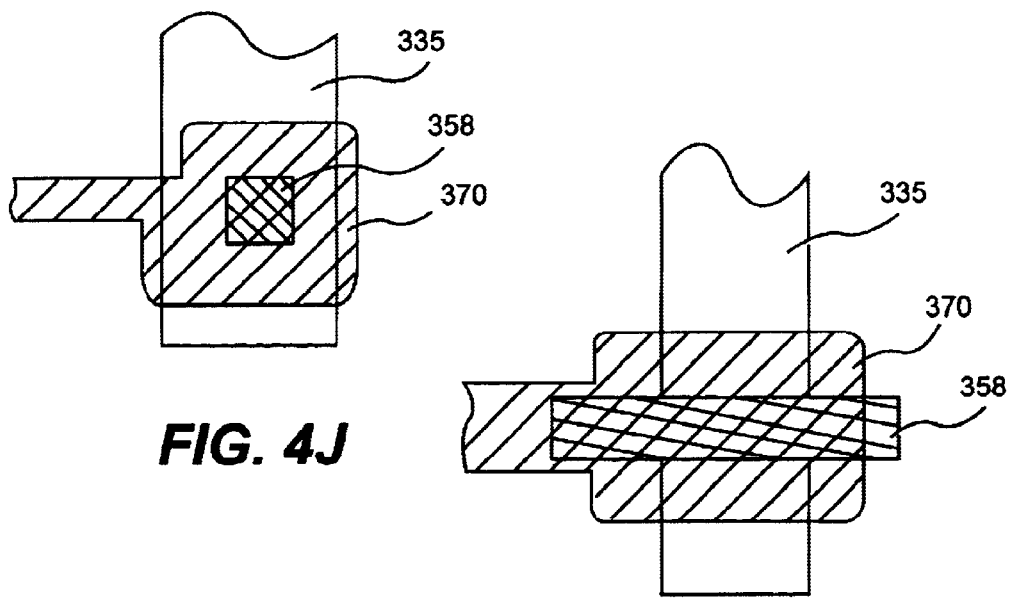
FIG. 4J
FIG. 4K

APPARATUS AND METHOD FOR MARGIN TESTING SINGLE POLYSILICON EEPROM CELLS

CROSS-REFERENCE TO RELATED APPLICATIONS

This is a Divisional application of prior application Ser. No. 08/995,873 filed on Dec. 22, 1997 U.S. Pat. No. 6,268,623, the disclosure of which is incorporated herein by reference.

This application claims the benefit of the filing date of Provisional Application Serial No. 60/041,026, entitled APPARATUS AND METHOD FOR MARGIN TESTING SINGLE POLYSILICON PROCESS EEPROM CELLS, filed Mar. 20, 1997.

BACKGROUND OF THE INVENTION

The present invention relates to quality control testing of non-volatile memory cells. More particularly, the invention relates to margin testing of single polysilicon process EEPROM cells.

Non-volatile memory cells include EPROM, Flash and EEPROM cells. EPROM and Flash cells are programmed by hot electron injection and erased by exposure to UV radiation and by Fowler-Nordheim tunneling, respectively. However, EEPROM cells are both electrically programmed and electrically erased by Fowler-Nordheim tunneling. Unlike EPROM and Flash cells, the threshold voltage associated with a discharged EEPROM cell is negative because electrons beyond the neutral state may be removed from the floating gate. This electron removal gives the floating gate a net positive charge. As described below, this difference can present a challenge to effective margin testing, particularly of the erase margin, in certain types of EEPROMs.

EEPROM cells may have a variety of configurations. In particular, EEPROMs may be formed from single or double polysilicon processes. A double polysilicon process EEPROM has a polysilicon control gate capacitively coupled to its floating gate. A single polysilicon process EEPROM does not have a polysilicon control gate, but instead has a second heavily doped diffusion implant in the cell's substrate which is capacitively coupled to its floating gate. Margin testing of single polysilicon ("single poly") EEPROMs are the focus of this invention.

A dual row line single polysilicon EEPROM cell 30 is shown in FIG. 1A. The cell includes a single polysilicon floating gate structure 32 which performs three functions. At a first end, a tunnel extension 34 of floating gate 32 acts as an electrode in the two terminal device used for tunneling electrons from a heavily doped N⁺ implant 35 (also referred to as a programming Memory Diffusion or MD) through a tunnel oxide 36 (often about 80 Å thick) onto floating gate structure 32. At the other end of this floating gate, a wide area plate 38 is employed as one electrode of a capacitor enabling the floating gate 32 to be raised to a high voltage (e.g., about 6 to 11 volts) by capacitively coupling a programming voltage (e.g., about 9 to 13 volts) from a second electrode 40 (heavily doped N+ silicon, referred to herein as a control gate memory diffusion) through an oxide 42 (often about 180 Å thick). Between these two ends is a section of polysilicon that forms the gate 44 of a read transistor (N2).

The read transistor (N2) is connected in series with a word line transistor (N1) having a gate 46 forming part of a word line (also referred to as a row line) 47. The read and word line transistors separate a sense amp negative (−) input 48 (a source line) from a sense amp positive (+) input 50 (a drain line). Charging the floating gate 32 by tunneling electrons onto it (through tunnel oxide 36) raises the threshold voltage of the read transistor (EEPROM cell 30 is programmed). This shuts off the channel between the sense amp inputs, even when the adjacent word line transistor is turned on. Tunneling electrons off the floating gate 32 reduces the read transistor threshold voltage to negative values, effectively turning this device on (EEPROM cell 30 is erased). The word line transistor in series then controls the signal path between the two sense amp inputs 48 and 50.

The EEPROM cell is programmed or erased by charging or discharging, respectively, the floating gate 32. In order to tunnel electrons onto floating gate 32, a high voltage must be applied to the control gate memory diffusion 40. At the same time, the write column 56 is grounded and the write column transistor (N3) is turned on by, for example, selecting the second row line 31 of the dual row line cell with, for example, 5 volts. The sense amp (−) input 48 can be biased from about 5 volts to a high voltage to assist tunneling electrons onto the floating gate 32. The voltage on the control gate memory diffusion 40 is capacitively coupled to the floating gate 32 as is the sense amp (−) input 48 voltage. The resulting positive voltage on floating gate 32 is sufficient to cause tunneling onto floating gate 32 through the tunnel oxide 36 where it intersects the floating gate (the tunnel oxide window 36a (shaded)), thereby programming the EEPROM cell 30.

In order to tunnel electrons off floating gate 32, a high voltage must be applied to memory diffusion 35 while ground is applied to the second heavily doped N+ implant (control gate memory diffusion) 40 which underlies and is capacitively coupled to the wide area plate 38. During this process, ground is also applied to sense amp (−) input 48. The application of high voltage to memory diffusion 35 is accomplished through a write column 56 and a write column select transistor (N3) including (i) a diffusion region 54 conductively connected to write column 56 for data input, (ii) a source/drain diffusion 58 electrically connected to memory diffusion 35, and (iii) a gate electrode 60, which is part of row line 31. When a sufficient potential is applied to the gate 60 of the write column select transistor through row line 31 while a write signal is applied through write column 56, electrons can tunnel off of the floating gate 32 to erase the EEPROM cell.

A further description of a typical EEPROM cell and its functional elements is available the publication "EPM7032 Process, Assembly, and Reliability Information Package" available from Altera Corporation of San Jose Calif. That document is incorporated herein by reference for all purposes.

In order for an MOS transistor to conduct, the voltage on its gate must overcome (be greater than) the transistor's threshold voltage ($V_{th}$). Generally, the threshold voltage is that gate voltage required to create an inversion layer in the transistor's channel so that it conducts, and is a function of the design and process criteria for the cell. When the MOS transistor is a programmable transistor, such as an EEPROM, there are two gates: The floating gate and the control gate. Such a cell will have two threshold voltages, corresponding to each of its programmed and erased states. The floating gate voltage required to invert the transistor ($V_{th}$) does not change for a given cell, but the control gate voltage to invert the transistor (that is, to bring the floating gate to $V_{th}$) differs depending upon the charged or discharged state of the cell.

Prior to shipping a non-volatile memory cell product, a manufacturer will generally test the cells to guarantee that each bit has a good margin, and that the bit will maintain its programmed or erased state over the lifetime of the cell. The "margin" is the voltage required on a cell's control gate to cause a change in the state of a bit of memory. As illustrated in FIG. 2, since a programmable cell has two threshold voltages, it will have two margin voltages: One for the programmed state and one for the erased state. In an EEPROM cell, an erased bit will have a lower margin voltage, typically between about −5V to 0V, and a programmed bit will typically have a higher margin voltage, typically between about 3V and 8V.

In normal cell operation, the EEPROM's control gate will typically be set at a value between the programmed and erased ranges, for example 1.7V. For margin testing, however, the control gate voltage is swept through ranges of voltages to determine the cell's threshold voltages. For example, for a charged cell the control gate may typically be swept from about 3V to 8V; and from about −5V to 0V for an erased cell.

In practice, margin testing requires a detector to determine when a margin voltage has been reached. This role is typically performed by a sense amplifier, such as that described with reference to FIG. 1A. A particular margin voltage will correspond to a "trip current" ($I_{trip}$), which is that current sufficient to switch the output of the sense amp from one bit state (e.g., output low) to another (e.g., output high). In this way, a sense amp may signal a cell tester when a margin voltage has been reached.

In EEPROM cells, an effective margin testing protocol will need to confirm both the program and the erase margin, and the maintenance of the floating gate's voltage over the lifetime of the cell. As noted above, in a typical margin testing protocol for an EEPROM cell, the voltage on the control gate is swept through the typical margin values of approximately −5V to 0V or 3V to 8V, depending whether the cell is discharged or charged, respectively, until the sense amplifier is tripped, indicating that the margin has been reached. The cell is then subjected to accelerated stressing conditions calculated to simulate the stresses which a cell may be expected to face over its lifetime. The margin is then again determined for the cell. If the margin is different than it was initially, it is an indication that the stresses have caused some charge to move onto the floating gate ("charge gain") or off the floating gate ("charge loss"), for discharged and charged cells, respectively. If the change is great enough, indicating that a guaranteed margin will not be maintained over the life of the cell, that cell is rejected.

From the above general description of margin testing, it should be apparent that in order to test a conventional EEPROM cell's erase margin (i.e., for the lower threshold voltage), the cell's control gate would have to be biased to a negative voltage. In a double poly cell this presents no problem since the control gate is isolated from other elements of the cell. However, in a single polysilicon process EEPROM, it is not possible to bias the control gate to a negative voltage. This is because, as noted above, the control gate in a single poly EEPROM is coupled to an N+ diffusion implant in the cell's P-substrate. In order for current not flow through the substrate, as must be the case for proper operation of the cell, the N-P junction of the implant and the substrate must remain backward biased; therefore, the implant must not bear a negative voltage. If a negative voltage was applied to the control gate implant, as would be required to margin a negative voltage, the N-P junction would be forward biased and charge would flow into the substrate disrupting proper cell operation.

Accordingly, there is a need for improved apparatuses and methods for margining single poly EEPROM bits.

SUMMARY OF THE INVENTION

The present invention provides apparatuses and methods for evaluating margin voltages in single poly EEPROM cells. Briefly, the invention involves shifting the cell's threshold voltage higher, resulting in a corresponding rise in the margin voltage, so that testing for the erase margin may be conducted in the positive voltage range. The present invention implements a variety of solutions to the problem, including both innovations in cell processing and circuitry.

In one embodiment, the process steps employed to create the floating gate transistor are changed in order to increase its threshold voltage. Alternatively, or in combination with these general process changes, the width of the floating gate transistor may be reduced, resulting in a corresponding increase in the margin voltage.

In addition to these process modifications, the present invention provides circuit modifications to conventional EEPROM designs that result in increased threshold voltages with erase margins in a single poly EEPROM's testable range. These circuit modifications include providing a separate test mode condition where the sense amp trip current is higher than under normal operation, and raising the source line's voltage level with a new sense amp optimization, or only during the margin testing mode, both of which shift the erase margin voltages for the cell into the testable range.

These and other features and advantages of the present invention will be described in more detail below with reference to the drawings.

BRIEF DESCRIPTION OF THE DRAWINGS

FIGS. 4A–I are cross-sectional and perspective views of important steps in the fabrication of the programming region of an EEPROM cell according to one preferred embodiment of the present invention.

FIGS. 4J–K are top views of alternative floating gate/tunnel window geometries for an EEPROM cell according to preferred embodiments of the present invention.

DETAILED DESCRIPTION OF THE PREFERRED EMBODIMENTS

The present invention will be described with reference to several preferred embodiments. It will be understood by those skilled in the art that variations of the described methods and apparatuses may be made without departing from the scope of the present invention.

The present invention provides apparatuses and methods for evaluating single polysilicon EEPROM cell margin voltages. The invention allows for an upward shift in the threshold voltage window for a single poly EEPROM for which erase margin testing would not otherwise be possible. The invention provides several different ways to address the problem which may be used alone or in combination. By raising the EEPROM transistors' threshold voltage, what would otherwise have been negative margin voltages are shifted into the testable range above 0V. Preferably, the threshold voltage shift will move the margin voltage to at least the minimum testable range of about 0.5V to 2.5V, in which range the sense amp will be tripped.

Figure 1A:
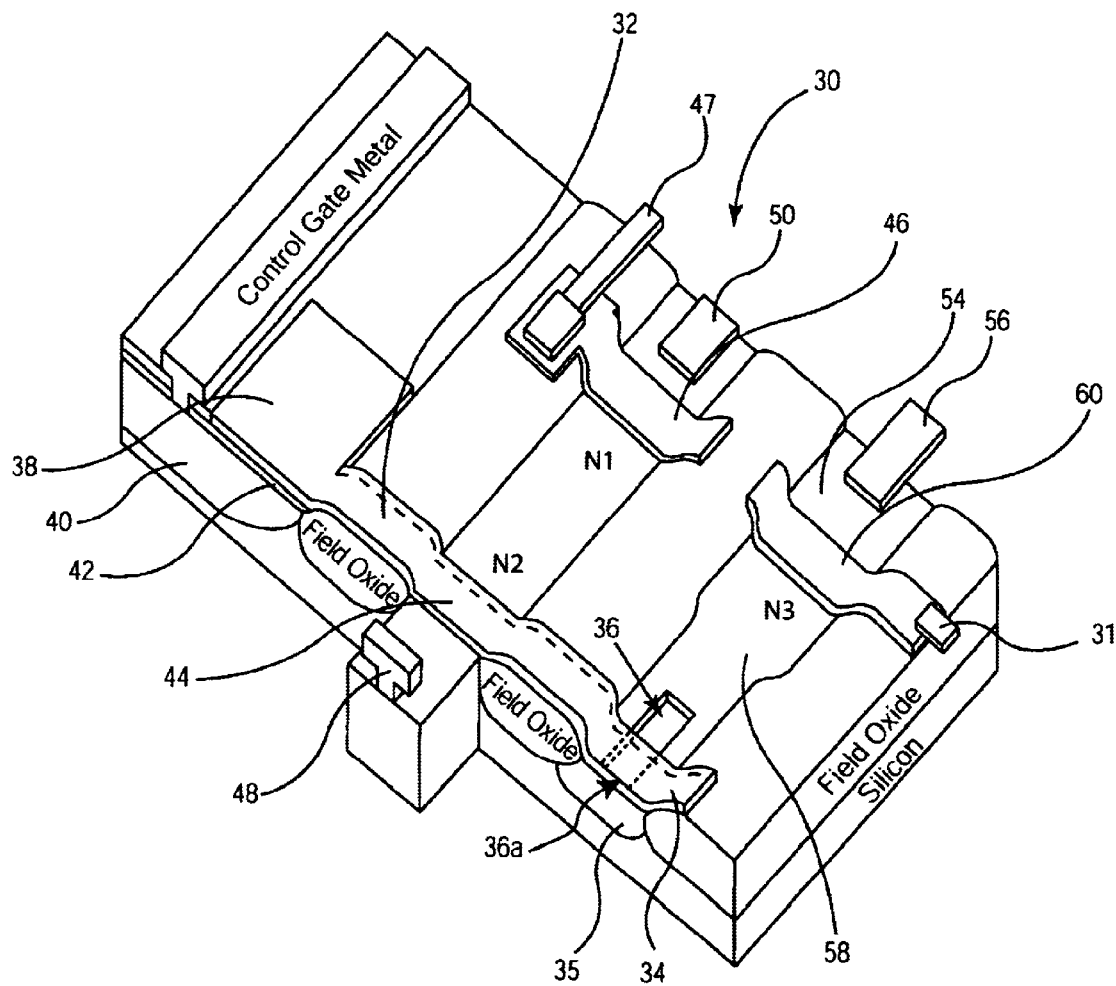
FIG. 1A is a cross-sectional perspective view of a single polysilicon EEPROM cell.
Figure 1B:
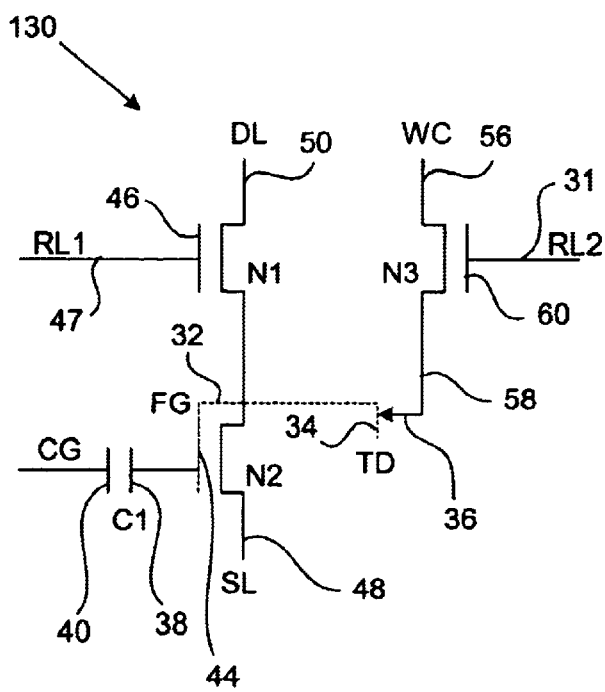
FIG. 1B is a schematic circuit diagram of an EEPROM cell such as the single poly EEPROM cell depicted in FIG. 1A.
Figure 2:
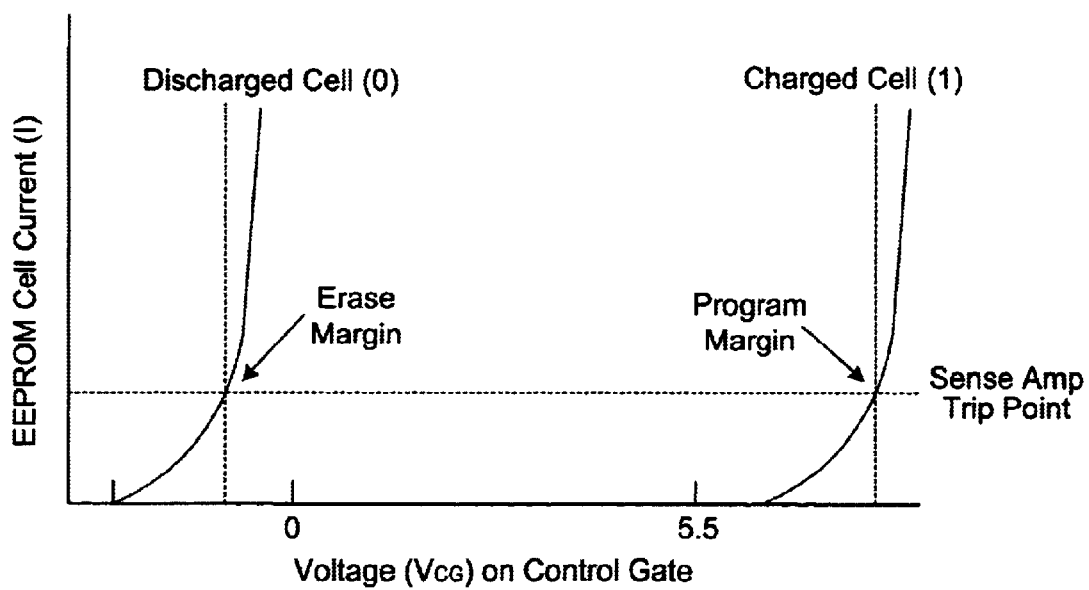
FIG. 2 is a current versus voltage graph illustrating the program and erase margins for a typical EEPROM cell.
Figure 3A:
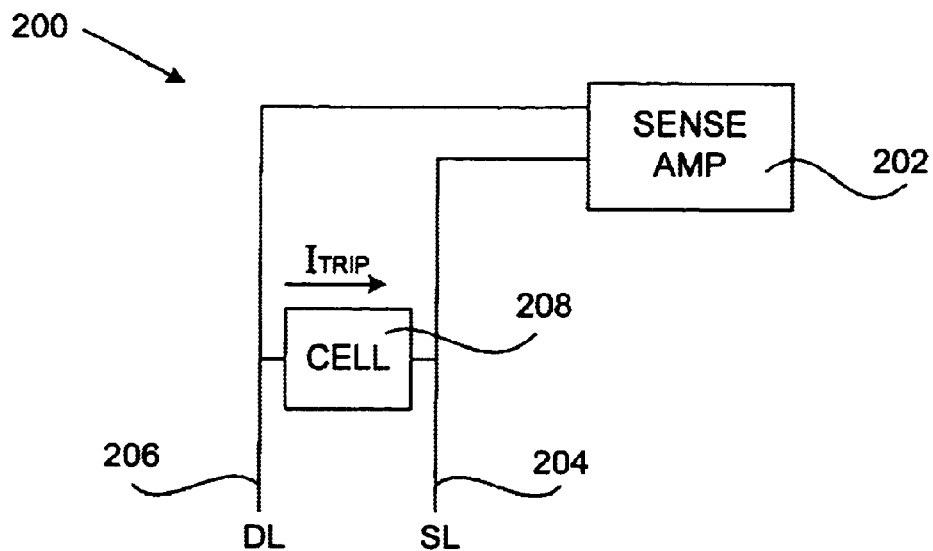
FIG. 3A is a schematic block diagram of a dual-ended sensing circuit according to the present invention, incorporating an EEPROM cell and a sense amplifier for operation and margin testing.
Figure 3B:
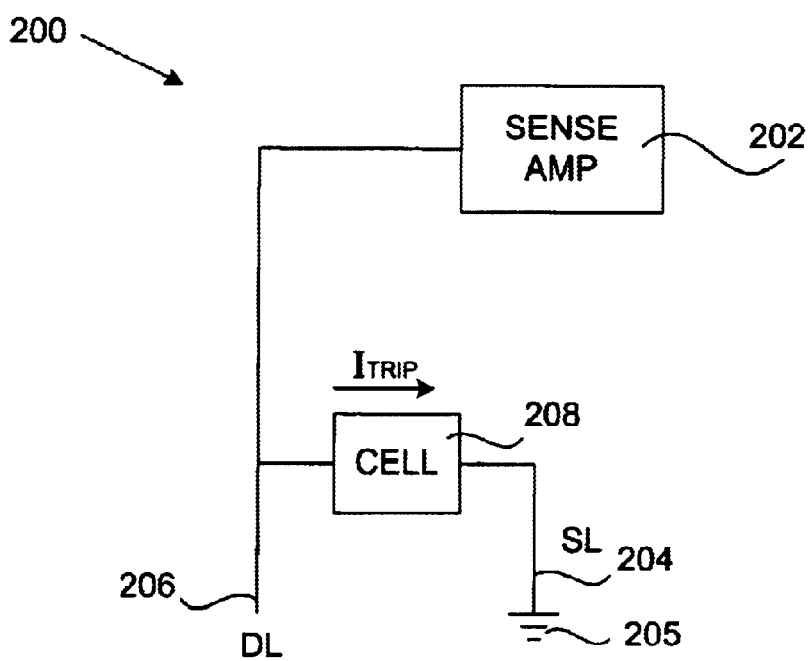
FIG. 3B is a schematic block diagram of a single-ended sensing circuit according to the present invention, incorporating an EEPROM cell and a sense amplifier for operation and margin testing.

The invention is described with reference to FIGS. 1A through 13. Margin testing makes use of the sense amps present in a device to detect margin voltages for an EEPROM cell. FIG. 1B is a circuit representation 130 of the cell 30 in FIG. 1A with the corresponding cell features and circuit representations identified by common reference numbers. The word line transistor, EEPROM transistor and write column select transistor are additionally designated N1, N2 and N3, respectively. FIGS. 3A and 3B are schematic block representations 200 and 201 of sense amp and EEPROM cell configurations used in margin testing according to preferred embodiments of the present invention, showing dual and single ended sensing, respectively. In FIG. 3A, the sense amp 202 is shown connected across the source 204 and drain 206 of the cell 208 (such as that depicted in FIG. 1B) so that it is able to detect a trip current (typically about 80 µA) moving through the EEPROM transistor N2 once the threshold voltage is reached in margin testing. FIG. 3B depicts an alternative embodiment of the present invention in which only the drain 206 is connected to the sense amp 202, while the source line 204 is connected to ground 205 and not to the sense amp 202. The trip current in the single ended sensing configuration 201 flows through the cell to ground 205.

Moreover, EEPROM devices may be fabricated so that there are a plurality of cells, each connected in parallel to a single sense amp along a common drain line (not shown). In this way several cells (one on each drain line) may be tested in parallel. By selecting a unique word line orthogonal to the drain line, individual cells can be tested by the same sense amp along the common drain line.

Process Modifications

Figure 5:
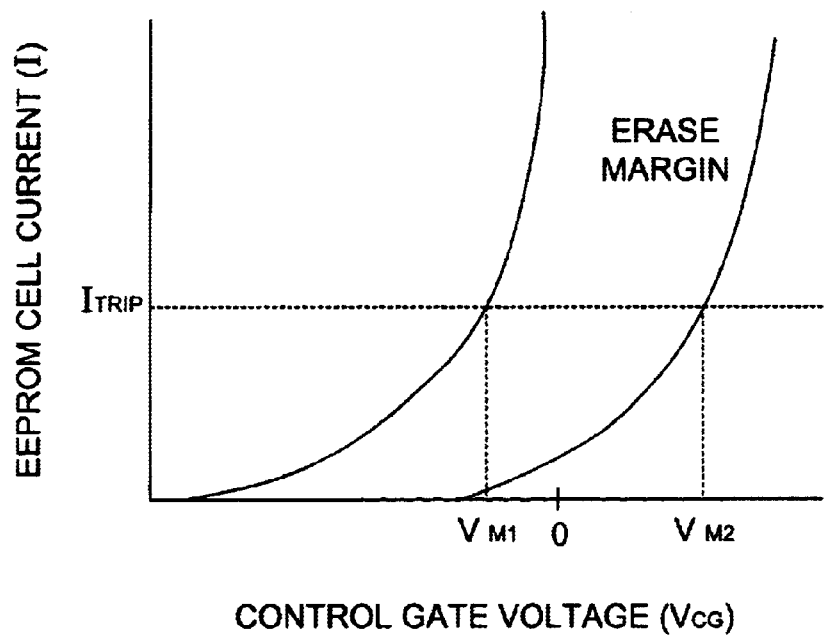
FIG. 5 is a current versus voltage graph illustrating the upward shift in erase margin resulting from a process change in accordance with the present invention.

In a first aspect of the present invention, the process for forming an EEPROM cell is modified such that the floating gate transistor 32 has a higher threshold voltage than in conventional cell designs. Among the parameters that may be changed to achieve this result in a preferred embodiment are the EEPROM transistor (N2) channel dopant concentration, the gate oxide thickness, the dopant concentration in the floating and/or control gates, the composition of the gate oxide, the thickness and composition of the control gate capacitor dielectric, and the coupling ratio between the floating gate and the control gate. These parameters may be altered according to any of the well-known methods in the art for forming and modifying these features. The result of this process modification is illustrated in FIG. 5.

An EEPROM cell's floating gate voltage ($V_{FG}$) is related to the voltage (initial) on the cell's floating gate ($V_{FG}^i$), and the control gate voltage ($V_{CG}$) applied to the cell by the following equation:

$$V_{FG}^i + V_{CG}*k = V_{FG} \quad (1)$$

where k is the coupling ratio between the control gate and the floating gate. The control gate voltage at which the EEPROM cell current reaches $I_{trip}$ is its margin voltage ($V_M$). The floating gate voltage where the cell current reached $I_{trip}$ is defined as the trip voltage ($V_{trip}$) of the EEPROM transistor.

Trip voltage is related to threshold voltage ($V_{th}$) by the following equation:

$$V_{trip} = V_{th} + x$$

where x, the voltage offset, is set by the trip current requirement of the sense amp to between about 0.5V and 2.5V for a typical device.

For margin testing, equation (1) may be rewritten as:

$$V_M = (V_{trip} - V_{FG}^i)/k = (V_{th} + x - V_{FG}^i)/k \quad (2)$$

The increase in threshold voltage results in a corresponding increase in margin voltage according to the $V_{trip}$ shift divided by the control gate coupling ratio. As shown in FIG. 5, for $I_{TRIP}$ which remains constant, the erase margin is shifted from a level for the unmodified cell $V_{M1}$ above 0 V to $V_{M2}$.

In a 0.5µ device size embodiment, the following process parameters may be used to produce an elevated-threshold EEPROM transistor according to the present invention: The EEPROM channel dopant concentration is preferably in the range of about 1e15 to about 5e17 cm$^{-3}$ of boron, more preferably in the range of about 1e16 to about 1e17 cm$^{-3}$ of boron, and most preferably about 6e16 cm$^{-3}$ of boron, the gate oxide thickness is preferably in the range of about 120 to about 350 Å, more preferably in the range of about 140 to about 240 Å, and most preferably about 155 Å, the dopant concentration in the floating gate is preferably in the range of about 5e17 to about 5e20 cm$^{-3}$ of phosphorus, more preferably in the range of about 1e18 to about 1e20 cm$^{-3}$ of phosphorus, and most preferably about 5e19 cm$^{-3}$ of phosphorus, and in the control gate preferably in the range of about 5e17 to about 1e20 cm$^{-3}$ of phosphorus, more preferably in the range of about 1e19 to about 1e20 cm$^{-3}$ of phosphorus, and most preferably about 2e19 cm$^{-3}$ of phosphorus, the composition of the gate oxide is $SiO_2$, the control gate capacitor dielectric thickness is preferably in the range of about 120 to about 400 Å, more preferably in the range of about 140 to about 240 Å, and most preferably about 180 Å and is composed of $SiO_2$, and the coupling ratio, k, between the floating gate and the control gate is preferably in the range of about 0.50 to about 0.95, more preferably in the range of about 0.65 to about 0.85, and most preferably about 0.75. While boron and phosphorus have been noted as preferred dopant species, other suitable dopant species may be substituted with attendant changes in design parameters according to conventional design criteria. Moreover, combinations of dopant species, such as arsenic and phosphorus in place of phosphorus, may also be used to achieve similar net doping levels.

It should be noted that the preceding description relates to an NMOS transistor, i.e., it has an n-type source, an n-type drain, and a p-type channel. Although not shown, the EEPROM transistor could also be a PMOS transistor having a p-type source, a p-type drain, and an n-type channel. In that case, the dopant concentrations specified herein for NMOSs could apply with equal validity to the PMOS—only the dopant conductivity types would be reversed. Other doping techniques known to those of skill in the art may also be used to achieve threshold and trip voltages in accordance with the present invention.

A second aspect of the present invention achieves an upward shift in the erase margin voltage to positive levels by reducing the width of the floating gate transistor 44 (FIG. 1B). Since current varies proportionally with the gate width, for a given trip current the trip voltage must be higher by the width ratio, and the margin voltage is again increased according to the $V_{trip}$ shift divided by the control gate coupling ratio.

Ideally, the gate width is minimized. In a preferred embodiment, the floating gate width is decreased to no more than about 4.5 times the gate length. For example, the floating gate width may preferably be reduced from a conventional size of about 2.5μ or larger in a conventional EEPROM having a 0.5μ gate length, to less than about 2.5μ, preferably from about 2.25 to about 0.5μ, more preferably from about 2.0 to about 1.0μ and most preferably about 2.0μ. Proportionate reductions may also be used depending on the scale of the EEPROM cell. For example, cells with 1.0μ gate lengths may have proportionally larger gate widths, cells with 0.35 or 0.25μ gate lengths may have proportionally smaller gate widths, in accordance with the relationship described above. Such a narrow floating gate may be formed by changing parameters in fabrication steps well known in the art; e.g., the gate width may be reduced in a photolithography reticle. Reducing the floating gate transistor width also helps in area reduction, which may lead to overall chip area reduction.

In a particularly preferred embodiment, both the above-mentioned implant modifications and floating gate narrowing approached are combined to provide a cell which will have an erase margin in the testable range of above 0 V, preferably about 0.5 to 2 V, for a single poly EEPROM.

FIGS. 4A–I illustrate some of the important steps in the fabrication of the programming region of an EEPROM cell in accordance with a preferred embodiment of the present invention. It should be understood that numerous variations of this process are permissible and within the scope of this invention. Further, it should be understood that the conditions recited herein are appropriate for devices having feature sizes of about 0.5 to 0.35μ. The process conditions may have to be modified somewhat for devices in other size regimes, according to design criteria known in the art.

Figure 4A:
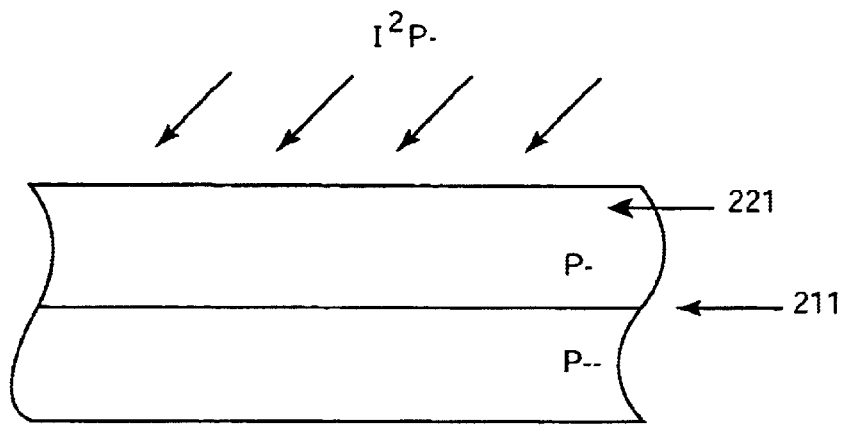

A semiconductor substrate, typically silicon, may be prepared for processing according to the present invention as follows. In FIG. 4A, a p-type ion implant is performed over a substrate 211, penetrating an upper portion of the substrate (the "p-well portion"). The p-type dopant is provided at a dose and energy sufficient to provide a very lightly doped well region 221. For example, this implant might be conducted with boron implanted at about $1\times10^{12}$ to $5\times10^{13}$ cm$^{-2}$ at an energy of between about 25 and 70 keV. A subsequent diffusion anneal may then be conducted at a temperature and for a time sufficient to smooth out the p-type dopant concentration over well region 221 to give a relatively uniform overall light p-doping level. The well formation conditions should be chosen such that the p-well region has a dopant concentration at the substrate surface (i.e., the channel region) of between about $5\times10^{15}$ and $1\times10^{17}$ cm$^{-3}$ (as discussed above). It should be noted that, in many systems, the shape and extent of the p-well is defined by providing the semiconductor material with an ion implant mask of photoresist or other suitable masking material prior to ion implantation. Further alternative embodiments include silicon wafers cut from single crystal silicon grown with a specific dopant concentration, and growing a layer of silicon of the desired bulk concentration epitaxially on top of a heavily doped substrate. Also, as noted above, the EEPROM transistor could also be a PMOS transistor having a p-type source, a p-type drain, and an n-type channel. In that case, the dopant concentrations specified herein for NMOSs would apply with equal validity to the PMOS—only the dopant conductivity types would be reversed.

Figure 4B:
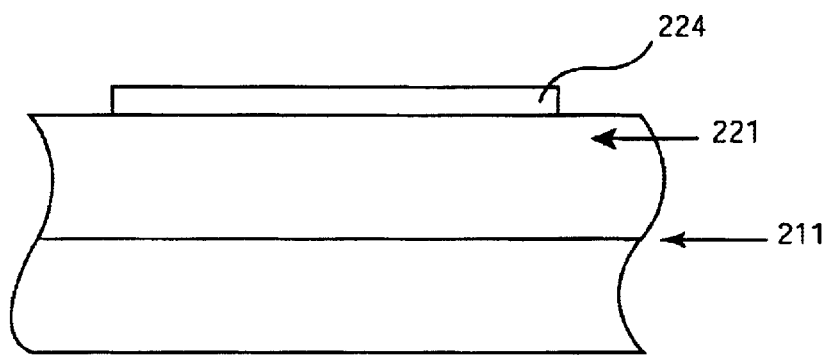
Figure 4C:
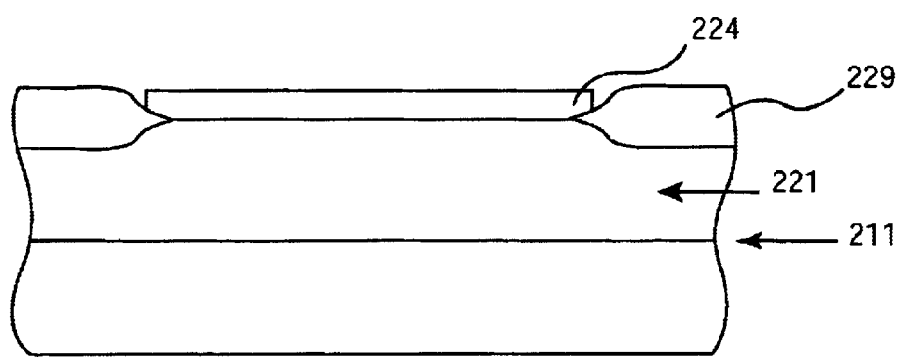
Figure 4D:
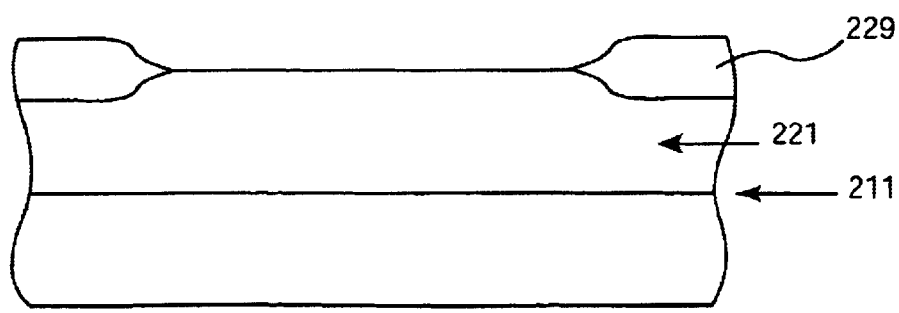

To obtain the structure shown in FIG. 4B, a thick SiN and thin SiO$_2$ stack mask 224 may be provided to protect the active areas (i.e., regions where electrodes, tunnel regions, channels, etc. are to be formed). Next, a thick field oxide 229 (preferably of silicon dioxide) is grown at a temperature of between about 850 and 1050° C. to a thickness of between about 0.2 and 0.7 micrometers to produce the structure shown in FIG. 4C. Thereafter, the SiN/SiO$_2$ mask 224 is removed to produce the structure shown in FIG. 4D. The field oxide 229 functions to electrically isolate the various devices and some device elements from one another on the substrate 211. In alternative embodiments, conventional isolation trenches could be used in place of the field oxide to isolate devices on the substrate 211. Further embodiments may utilize "recessed LOCOS," "poly-buffer LOCOS," and a wide variety of specialized isolation schemes to grow the field oxide 229.

Figure 4E:
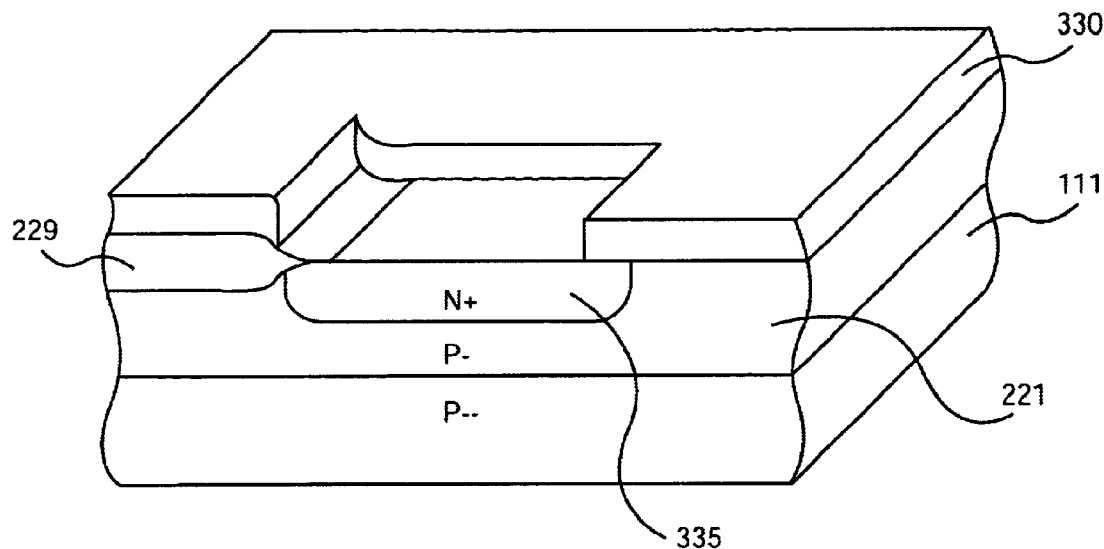

FIGS. 4E–I provide perspective depictions of further steps in the fabrication of the programming region of an EEPROM cell according to the present invention will be described. As shown in FIG. 4E, after the bare silicon substrate has been exposed following the field oxide growing step, another photoresist mask 330 is provided such that an area of the silicon substrate surface bounded by the field oxide 229 is left exposed. Then an n-type ion implant is performed over the substrate 211, penetrating the substrate's exposed p-well region 221 to create a region underlying the substrate surface that has an n-type conductivity (the programming "memory diffusion" or "MD" region 335). For example, the n-type dopants phosphorus and arsenic may be provided at doses of between about $5\times10^{13}$ to $1\times10^{15}$ and $1\times10^{14}$ to $1\times10^{16}$, respectively, at an about 80 to 200 keV and 60 to 100 keV, respectively, which is sufficient to provide a highly doped MD region 335. This implant produces an n-type dopant concentration of about $1\times10^{18}$ to $1\times10^{20}$ cm$^{-3}$ in an MD region about 0.4 and 0.8 μm deep immediately under the substrate surface. In the completed device, this area will provide diffusion regions 35, 40 and 44. Following this n-type ion implant step, the photoresist is removed and the implant may be annealed with a high temperature (for example, about 800 to 1000° C.) diffusion cycle.

At this stage, threshold voltage adjustment implants may be performed on the device substrate in order to set appropriate transistor threshold voltages. In a preferred embodiment, the word line (N1) and floating gate (N2) transistors have the doping in their channels supplemented ("enhanced") by the implants to increase their threshold voltage levels. A higher threshold voltage gives a lower current for the same biases applied to the cell. In a preferred embodiment, the floating gate transistor (N2) (not shown in FIGS. 4A–I) is not blocked, and thus receives an enhancement implant along with the word line (N1). The write column select (N3) transistor is blocked to make a low threshold native device (i.e., a device without an implant). The implant may be conducted with boron (B) ions at a dose of preferably between about 5e11 and 5e13 $cm^{-2}$ at an energy of between about 10 and 50 keV more preferably between about 1e12 and 1e13 $cm^{-2}$ at an energy of between about 15 and 30 keV and most preferably about 1.5e12 $cm^{-2}$ an energy of about 2.0 keV. Methods for generating these implants are well known in the art.

In a preferred embodiment, the floating gate transistor is changed from an enhancement implant-blocked transistor with a threshold voltage of approximately 0.3 V (in a conventional cell) to one with an enhancement implant having a threshold voltage of preferably in the range of about 0.5 to about 1.1 V, more preferably in the range of about 0.7 to about 0.9 V, and most preferably about 0.8V. In the most preferred embodiment, this results in a trip voltage of approximately 1.7V, compared to the 1.2V trip voltage of the unmodified cell. Of course, other modifications resulting in increased threshold voltages are also possible in accordance with this invention.

Figure 4F:
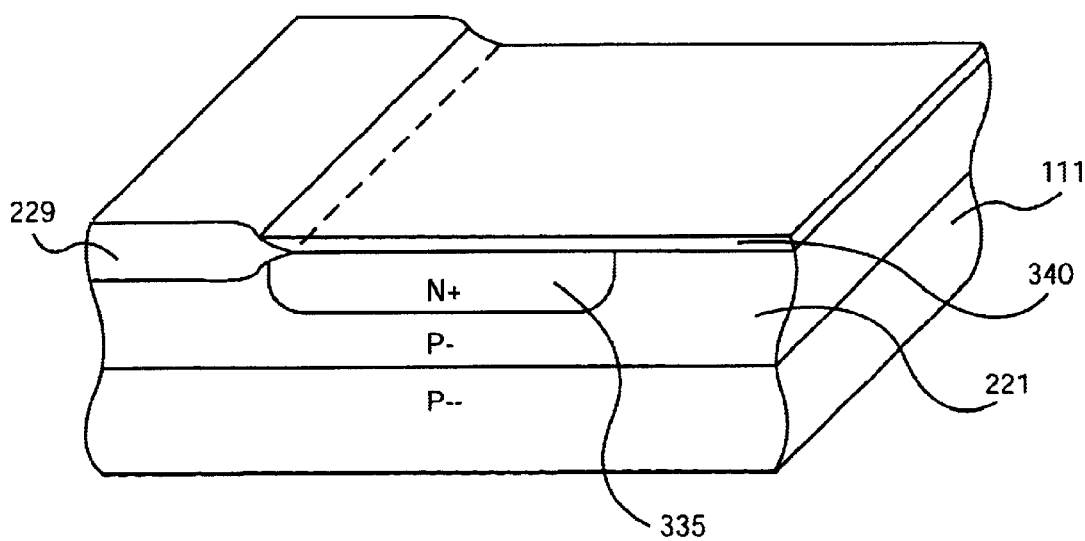

Next, as shown in FIG. 4F, a thin gate oxide 340 is grown on the bare silicon surface in an oxygen-containing atmosphere at a temperature of between about 800 and 950° C. for about 6 to 20 minutes to produce a thickness of between about 145 and 190 Å over the MD region 335. Because the gate oxide grows more quickly over the highly doped MD region 335 than the well 221, the thickness of the gate oxide outside of the MD 335 will be slightly less, about 125 to 170 Å. Typically, the gate oxide 340 will be a single layer of silicon dioxide, but it may also be a multi-layer structure including, for instance, silicon nitride. (Technically, such multi-layer structures should be referred to as "gate dielectrics" rather than merely "gate oxides").

Figure 4G:
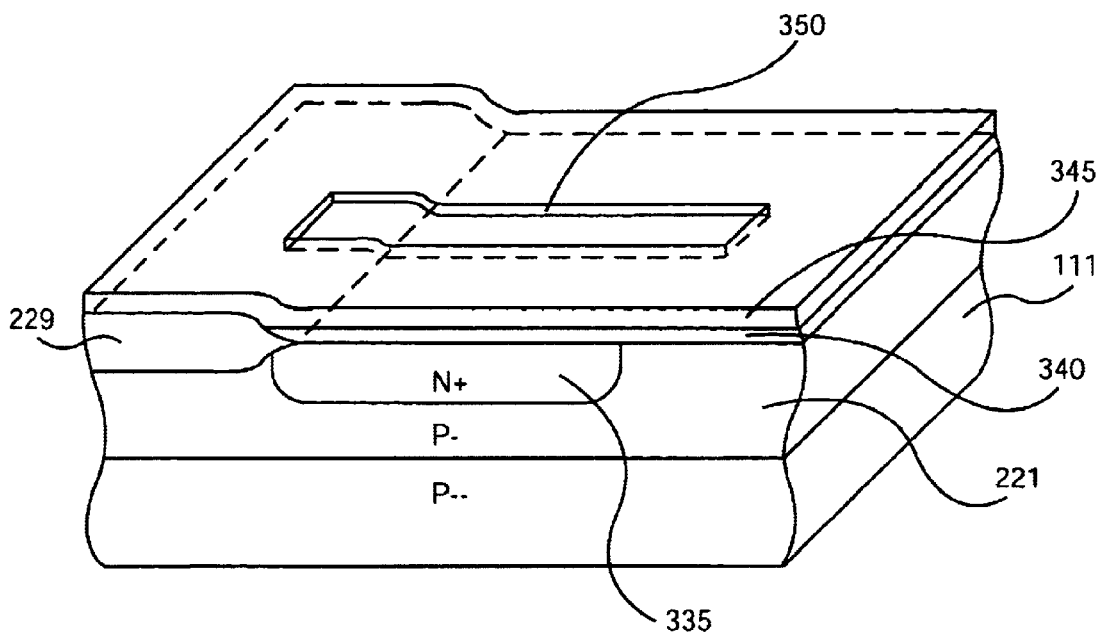

As shown in FIG. 4G, in one embodiment, after the gate oxide or gate dielectric has been formed, a photoresist mask 345 may be applied, leaving only a slot 350 whose width is selected to be a first dimension of the desired tunnel oxide window. For example, this slot may have the following range of dimensions: width, about 0.25 to $0.7\mu$ by length, about 0.75 to $3.0\mu$. After the mask 345 is formed, the gate oxide exposed in the slot area 350 is removed, for instance, with a wet $SiO_2$ etch using 1% HF or 10:1 buffered HF solution. The wet etch will generally make the final window dimension about 0.05 to $0.1\mu$ per side larger than the mask 345 dimensions.

The exposed silicon surface should be as smooth as possible. Additional surface smoothening may be conducted by further oxidation and/or by other processing methods known in the art, such as RCA cleans.

Figure 4H:
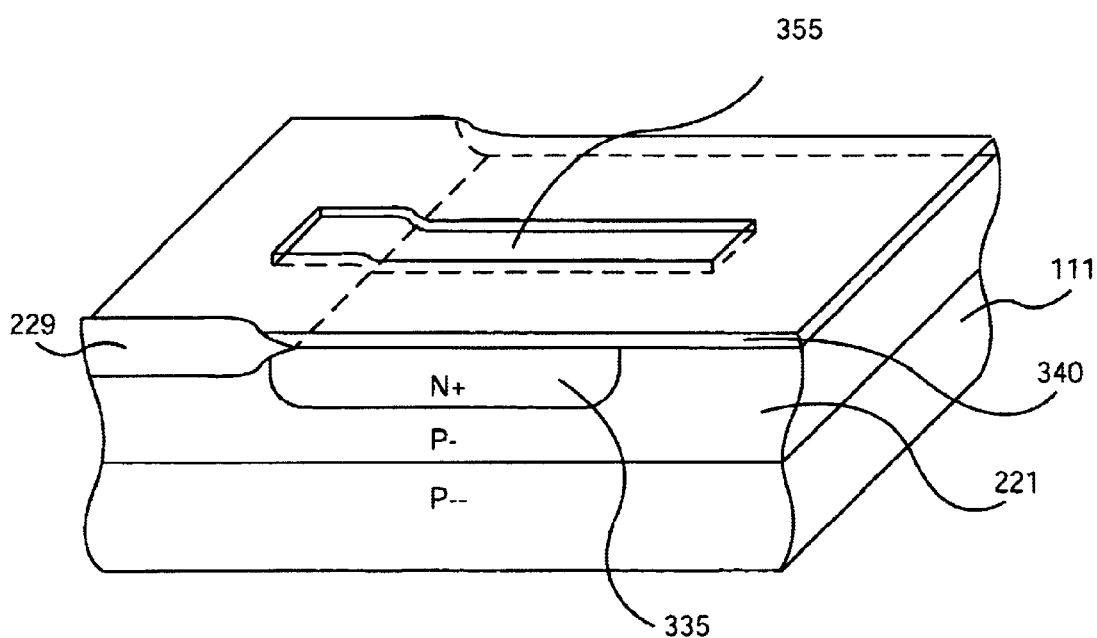

The structure of FIG. 4H is produced by removing the photoresist used during the most recent etch step. This leaves a region of bare silicon 355 within the gate oxide region 340 on substrate 211 overlying at least a portion of the MD 335. Note that the region 355 may extend into the field oxide region 229. Then, as shown in FIG. 4I, a tunnel oxide layer 358 is grown over the slot of bare silicon surface 355 created by the etch. A tunnel oxide 358 is generated by thermal oxidation at about 850° to 950° C. for about 7 minutes in a dry $O_2/Cl$ atmosphere so that the bare silicon surface in the slot 355 is converted to an oxide layer of about 70 to 100 Å in thickness. This thermal oxidation will further increase the thickness of the gate oxide layer to about 160 to 200 Å over the MD region 335, and about 145 to 190 Å over the well 221.

Next, in order to form the floating gate, a blanket of polysilicon 360 approximately 1000 to 2000 Å in thickness is deposited over the device surface by, for example, chemical vapor deposition. The polysilicon layer may be followed by a silicide (e.g., $WSi_2$) layer (not shown) of about 1000 to 2000 Å.

To produce the structure of FIG. 4I, a strip of photoresist mask 365 may be formed on the surface of polysilicon (or polysilicon/silicide) layer 360 and oriented 90 degrees from the longer axis of the tunnel oxide slot 355. The mask 365 defines two edges of the desired tunnel oxide window (with the other edges being defined by the tunnel oxide mask). Once the mask 365 is in place, an etch is used to remove the unmasked polysilicon while minimizing damage to the tunnel window edge. Since charging and tunnel oxide removal along the polysilicon edge may degrade the tunnel oxide reliability and endurance, the etch should be highly selective to polysilicon over $SiO_2$, approximately 20–100:1, so as to minimize the amount of tunnel oxide removed from along the edges of the polysilicon. The etch should also minimize the charge on the polysilicon after the floating gates are isolated during the etch. An example of a suitable etch is a reactive ion etch (RIE) using $SF_6/Cl_2$. Once the mask 365 is removed, a strip of polysilicon (or polysilicon/silicide) 370 (the floating gate) intersecting the tunnel oxide 358 remains.

It should be noted that there are many possible alternative geometries for polysilicon floating gates over tunnel windows in accordance with the present invention. For example, FIG. 4J shows a top view of an embodiment in which the polysilicon gate 370 fully covers the tunnel oxide window 358. Also, FIG. 4K shows an embodiment in which the polysilicon gate 370 fully covers the intersection area between the tunnel oxide window 358 and the memory diffusion 335.

As described above with relation to FIGS. 1A and 1B, this floating gate 370 extends from the programming region to form the gate of the EEPROM transistor (N2) 44 and into the wide area plate 38 which is capacitively coupled to the control gate memory diffusion 40. The width of the gate in the EEPROM transistor (N2) may be determined by the dimensions of the photolithographic mask used during its formation, as described with relation to other EEPROM cell features, above.

EXAMPLE

This example illustrates the improved margin testability of single polysilicon EEPROM cells achieved through process modifications according to the present invention. The example is presented in tabular form showing the voltages for a conventional cell (CONV) versus a cell modified in accordance with the present invention (INV). In Table A, the floating gate transistor is changed from an enhancement implant-blocked transistor with a threshold voltage of approximately 0.3 V to one with an enhancement implant having a threshold voltage of approximately 0.8 V (INV1). In Table B, the floating gate transistor width is decreased to approximately $2.0\mu$ from approximately $2.5\mu$ (INV2). The coupling ratios, k, for the cells of this example are as follows: Control gate/floating gate (Kcg-fg)=0.70; control gate/read transistor (Kcg-rd)=0.12; control gate/tunnel node (Kcg-td)=0.15; control gate/remaining parasitics (Kcg-rest)=0.03. The following abbreviations are used in the table: FG—floating gate; SA—sense amp; Vth—threshold voltage; and W—floating gate transistor width.

TABLE A

| Feature | CONV | INV1 | Comment |
|---|---|---|---|
| FG transistor $V_{th}$ | 0.3 | 0.8 | Process change to achieve $V_{th}$ increase |
| Trip voltage from floating gate | 1.2 | 1.7 | $V_{trip} = V_{th} + 0.9$ (set by SA design) |
| Erased FG initial charge | 1.3 | 1.3 | Starting FG charge not changed by $V_{th}$ shift |
| Programmed FG initial charge | −2.5 | −2.5 | Starting FG charge not changed by $V_{th}$ shift |
| Erased bit margin voltage | −0.14 | 0.57 | Erased margin now in testable range |
| Programmed bit margin voltage | 5.29 | 6.00 | Programmed margin is not a concern in this case |

TABLE B

| Feature | INV1 | INV2 | Comment |
|---|---|---|---|
| FG transistor width in microns | 2.5 | 2 | Layout change to reduce width of FG transistor |
| Trip voltage from floating gate | 1.7 | 1.9 | Vtrip = Vth + 0.9 for W = 2.5, and Vtrip = Vth + 1.1 for W = 2.0 (set by SA design) |
| Erased FG initial charge | 1.3 | 1.3 | Starting FG charge not changed by W change |
| Programmed FG initial charge | −2.5 | −2.5 | Starting FG charge not changed by W change |
| Erased bit margin voltage | 0.57 | 0.86 | Erased margin now in testable range |
| Programmed bit margin voltage | 6.00 | 6.29 | Programmed margin is not a concern in this case |

The results of this example demonstrate that by changing floating gate transistor threshold voltage from 0.3 to 0.8, the erased cell margin was changed from an untestable −0.14 volts to a testable 0.57 volts. Moreover, by additionally changing the floating gate transistor width W from 2.5 to 2.0, the erased cell margin was further increased from 0.57 to 0.86 volts.

Circuit Modifications

Figure 6:
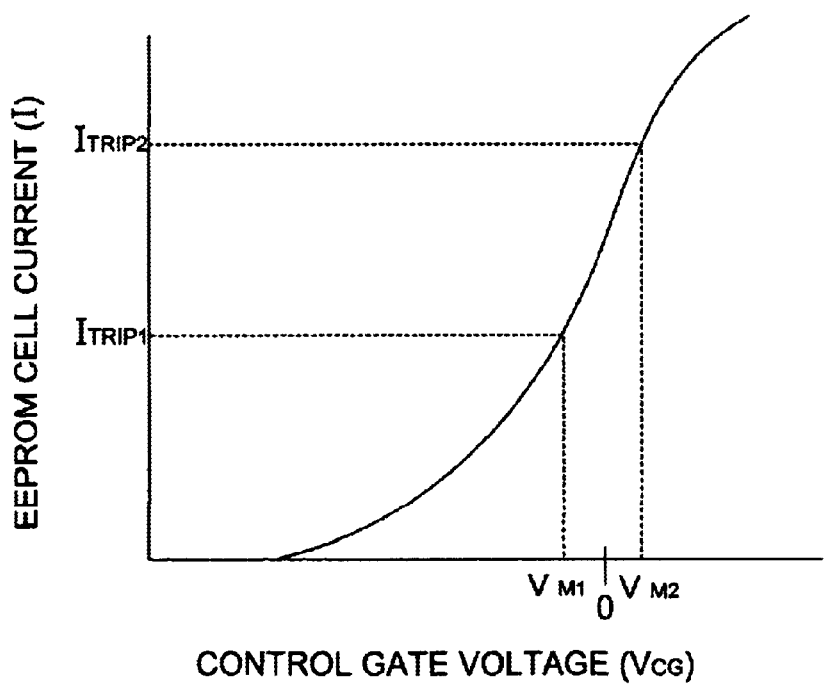
FIG. 6 is a current versus voltage graph illustrating the upward shift in erase margin resulting from a circuit change in accordance with the present invention.

In addition to the process changes, the margin voltage of a cell may be increased by changes in cell circuitry. In one embodiment, separate test mode circuitry for margining erased bits where the sense amp trip current is higher than under normal operation are added to a conventional cell. This higher trip current can be achieved by increasing the pull up current of the sense amp circuits in the margin mode with, for example, a parallel PMOS transistor that is enabled by control logic. As shown in FIG. 6, the increased trip current $I_{TRIP2}$ corresponds to a higher margin voltage $V_{M2}$ on the control gate.

Figure 7:
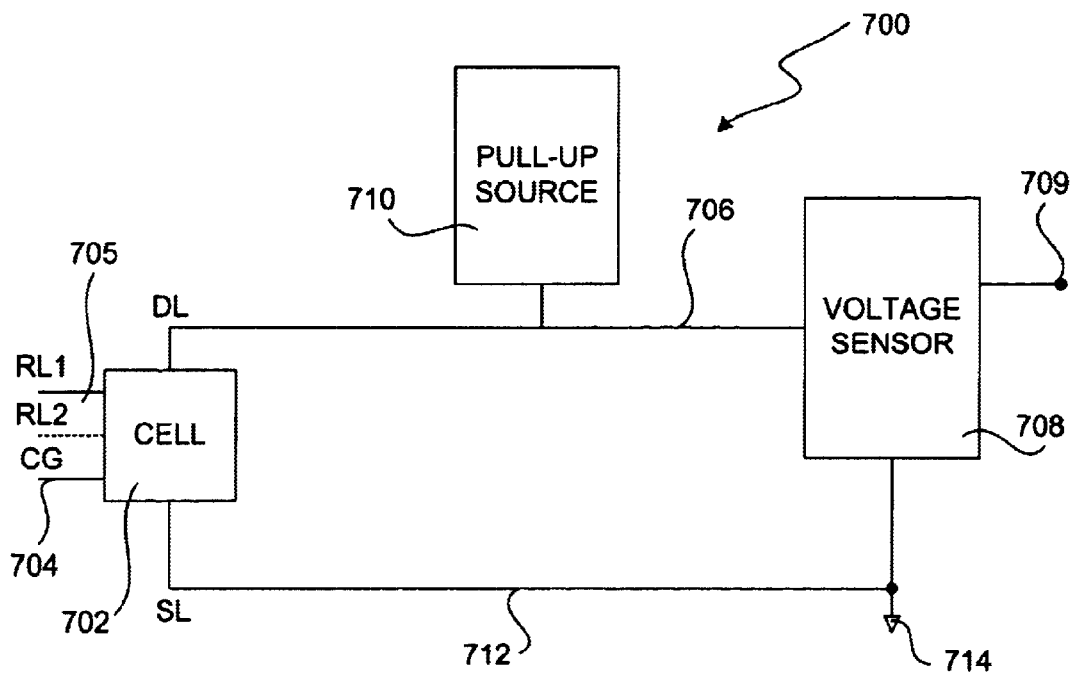
FIG. 7 is a block diagram representing a conventional EEPROM circuit design.

Preferred embodiments of this aspect of the present invention are illustrated with reference to FIGS. 7 through 9. FIG. 7 is a block diagram of a conventional circuit incorporating a single polysilicon EEPROM cell. The circuit 700 incorporates an EEPROM cell 702 (such as depicted in FIG. 1B). The cell 702 has a control gate 704 and one (for single row line cell) or more (e.g., two, for a dual row line cell) row lines 705 connected to $V_{CC}$. The cell 702 is also connected to a voltage sensor (sense amp) 708 by a drain line 706. Output node 709 provides the sense amp output. The drain line 706 additionally has connected to it a pull-up source 710. The circuit is then completed by source line 712, which is connected to ground 714, in order to bias the cell 702.

It should be understood that references to "ground" or "$V_{CC}$" are intended to include voltages at or near these levels; the distinction between the two voltages being that they represent digital logic low and high (0 and 1), respectively.

During margin testing, the voltage on the control gate 704 is swept up from about 0 V until the margin voltage is reached. The margin voltage in this instance is defined by the voltage on control gate 704 required to produce a current traveling through the cell 702 which would pull the drain line 706 down in voltage enough so that the voltage sensor 708 will sense that it has switched. The drain line 706 is initially held at a relatively high voltage by a pull-up source 710, having a current such that a certain current (the trip current, $I_{TRIP}$) going through the cell 702 will trip the sense amp 708.

Figure 8:
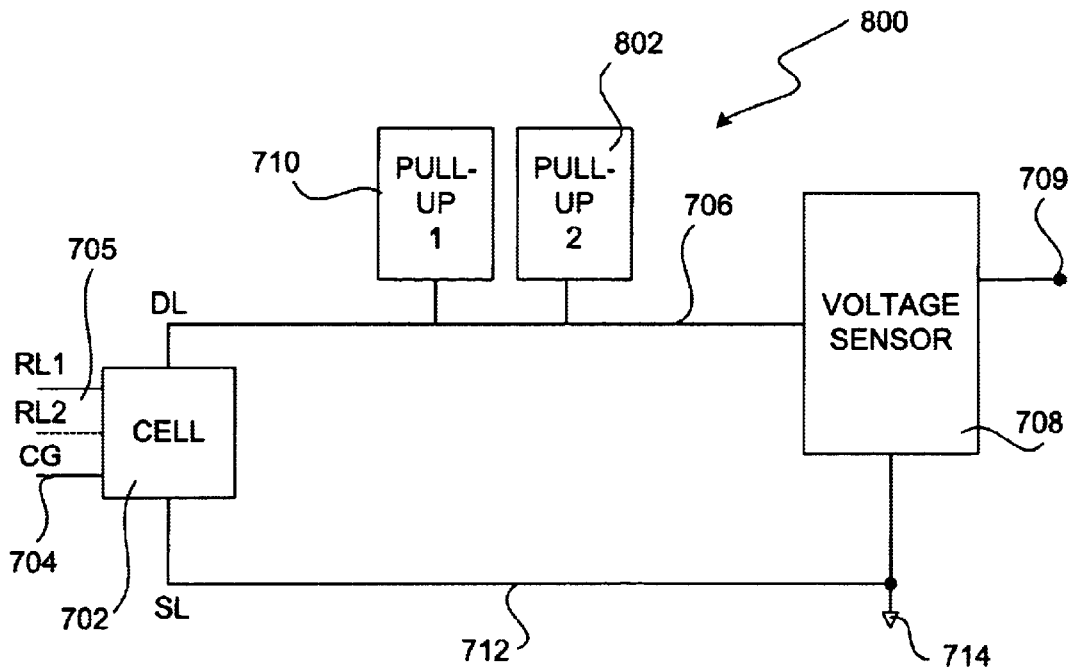
FIG. 8 is a block diagram representing an EEPROM circuit design according to one embodiment of the present invention.

FIG. 8 is a block diagram of a circuit incorporating an EEPROM cell according to a preferred embodiment of the present invention. This circuit 800 differs from the conventional circuit 700 depicted in FIG. 7 in that it has an additional pull-up source 802, which may be used in a separate circuit test mode in order to maintain the initial high voltage on the drain line 706 by applying extra current to the drain line node 706. Additional current is then required in the cell 702 in order to pull the drain line 706 down to the trip current. This higher current in the cell is produced by application of an increased control gate voltage. In a preferred embodiment of the present invention the additional pull-up source 802 is designed so that the control gate voltage required to bring the drain line node 706 to the trip current is above 0 V.

Figure 9:
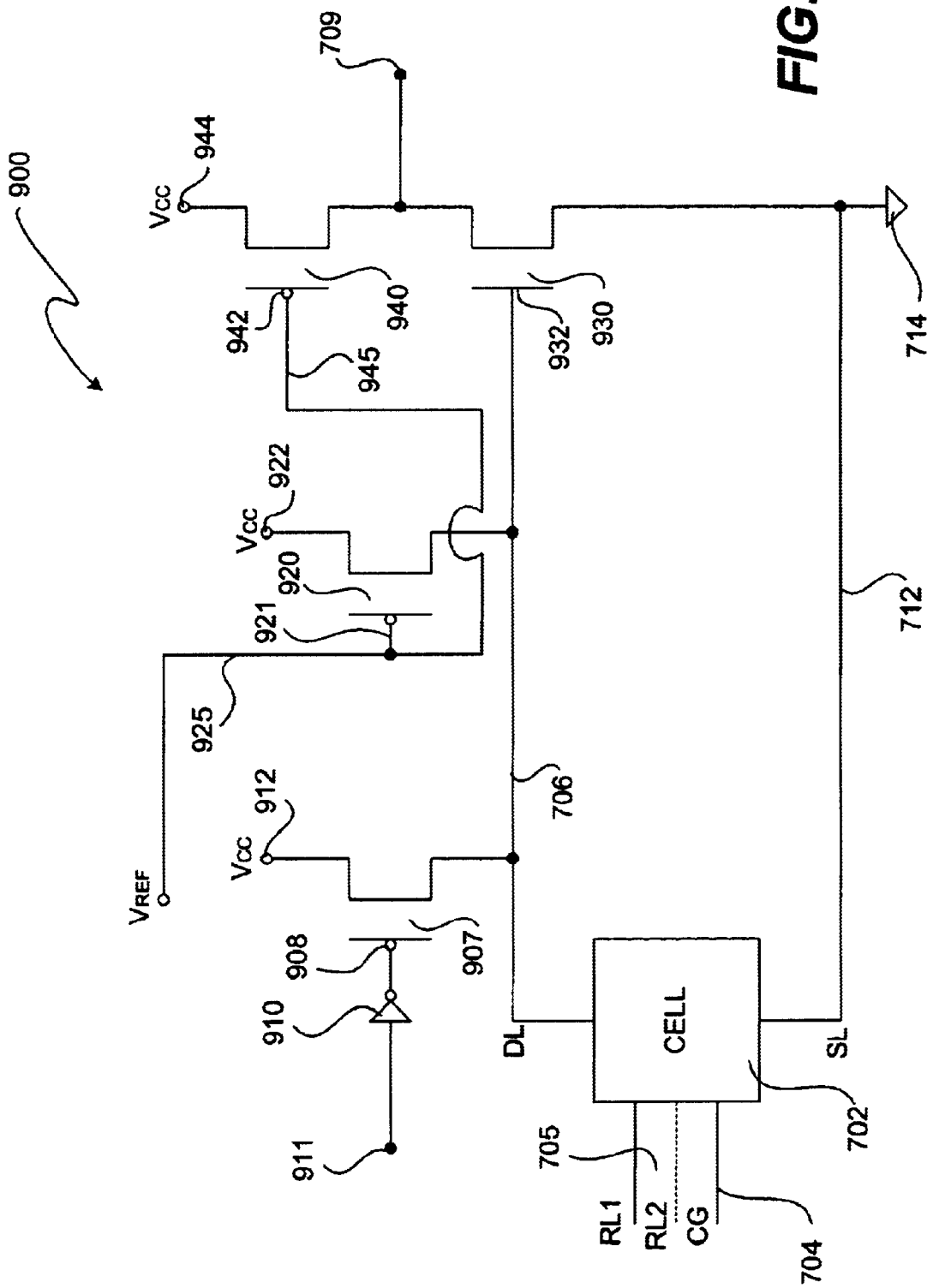
FIG. 9 is a circuit schematic diagram representing one specific circuit design according to an embodiment of the present invention in accordance with the block diagram of FIG. 8.

FIG. 9 depicts a more detailed view of a circuit in accordance with the block diagram of FIGS. 7 and 8. Like the conventional circuit 700, the circuit 900 includes an EEPROM cell 702 (such as depicted in FIG. 1B). The cell 702 has a control gate 704 and one or more row lines 705. The cell 702 is connected with a drain line 706 to an n-channel transistor 930. The drain line 706 is also connected to a transistor 920, which has its source 922 connected to $V_{CC}$ (or other relatively high voltage). The gate 921 of transistor 920 is connected by a reference voltage line 925 to a reference voltage between ground and $V_{CC}$ which may be varied to adjust the functionality of the sense amp. This transistor 920 and its associated features correspond to pull-up block 710 in FIGS. 7 and 8.

The sense amp, represented by block 708 in FIGS. 7 and 8, is composed of an n-channel transistor 930 and a p-channel transistor 940, and their associated features depicted in the specific embodiment depicted in FIG. 9. The gate 942 of the p-channel transistor 940 is connected to a reference voltage by line 945, and the p-channel source 944 is set to $V_{CC}$. The n-channel transistor gate 940 is connected to the drain line 706. Output node 709 provides the sense amp output. The circuit 900 is completed by the connection of the n-channel transistor 930 to ground 714 and back to the cell 702 through source line 712.

In a conventional circuit design, the n-channel transistor 930 of the sense amp has its gate 932 connected the drain line 706. As the cell 702 is turned on by raising the control gate 704 voltage, the current flowing through the cell 702 to the source line 712, which is grounded, pulls drain line node 706 voltage down. As it does so, the n-channel 930 will slowly be turned off because its gate voltage will reach the threshold voltage of that device. The voltage at output node 709 will start rising, pulled up by the p-channel transistor source 944, as the n-channel transistor 930 is turned off; that is, as the voltage at drain line node 706 goes down. Therefore, when the output node 709 voltage increases to the p-channel transistor source 944 voltage, typically $V_{CC}$, it will be sensing that the cell 702 has turned on. The voltage on the control gate 704 at that moment is called the margin voltage.

In EEPROM cells, this margin voltage, particularly for a discharged cell, may be negative. As noted above, it is not possible to test a negative margin voltage in single polysilicon process EEPROM cells.

FIG. 9 additionally shows the drain line 706 connected to a p-channel transistor 907 having a gate 908. Gate 908 is controlled by an inverter 910. The gate source line 912 is connected to $V_{CC}$. P-channel 908, inverter 910 and source 912 correspond to pull-up block 802 in FIG. 8. This additional circuitry provides a test mode for the circuit 900, as follows: In normal operation, the signal on test node 911 is low. This low logic signal is inverted to a high logic signal by the inverter 910, which turns the p-channel transistor 908 off. When the transistor 908 is off, it does not supply current to the drain line 706, so the cell 702 only has to supply enough current to pull the drain line 706 down against the current flowing through transistor 920.

In test mode, the signal on test node 911 is high. This low logic signal is inverted to a low logic signal by the inverter 910, which turns the p-channel transistor 908 on. When the transistor 908 is on, it supplies additional current to the drain line 706, so that the cell 702 must supply enough current to pull the drain line 706 down against the current flowing through both transistor 908 and transistor 920. Since the additional pull-up source increases the amount of current that the cell must work against to reduce the drain line voltage to ground and thereby trip the sense amp, the control gate 704 voltage of the cell 702 must be increased. In this way, the margin voltage in raised into the testable range at or above 0 V. Of course, this embodiment of the invention may be implemented in other specific ways, including circuit designs which lack inverters.

A further embodiment of the present invention increases an EEPROM cell's erase margin voltage by raising the source line voltage level either with a new sense amp optimization, or only during margin mode testing. This results in increased threshold voltage of the cell's floating gate transistor due to the body effect and reduced drain line 706 to source line 712 voltage ($V_{DL-SL}$). The body effect increases the threshold voltage to turn on the transistor (N2) in the EEPROM cell (see FIG. 1B). This causes a need for higher voltage on the control gate 704 of the cell 702 to turn on the cell (get current through the cell). Secondly, the higher source line 712 (FIG. 10) voltage causes a reduced $V_{DL-SL}$ which also causes an increase of voltage on the control gate to get enough current to pull the drain line down to trip the sense amp.

Figure 10:
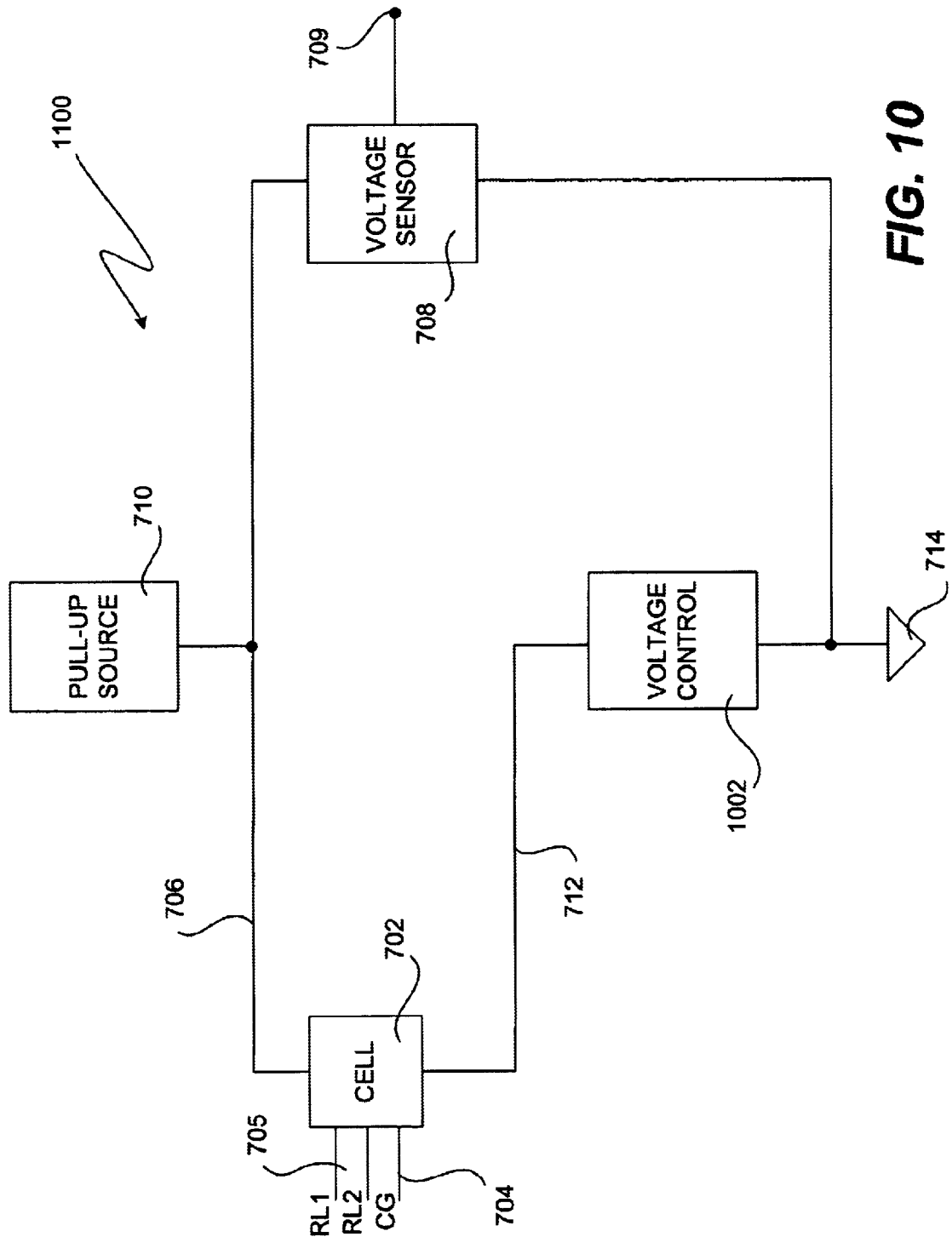
FIG. 10 is a block diagram representing an EEPROM circuit design according to another embodiment of the present invention.

Preferred embodiments of this aspect of the present invention are illustrated with reference FIGS. 7, 10 and 11. As described above, FIG. 7 is a block diagram of a conventional circuit incorporating an EEPROM cell. FIG. 10 shows a circuit 1000, which differs from the conventional EEPROM circuit by the addition of a voltage control block 1002. As a result, the source line 712 is no longer directly connected to ground 714. The voltage control block 1002 corresponds to a circuit (a preferred embodiment of which is described with reference to FIG. 11, below) which is designed to raise the source line 712 bias voltage, for example, in a test mode. In order to have the same current (e.g., $I_{TRIP}$) through the circuit 1000 with the increased bias voltage on the source line 712, the control gate 704 bias must also be raised. In this way, the control gate voltage is increased into the testable region at or above 0 V.

Figure 11:
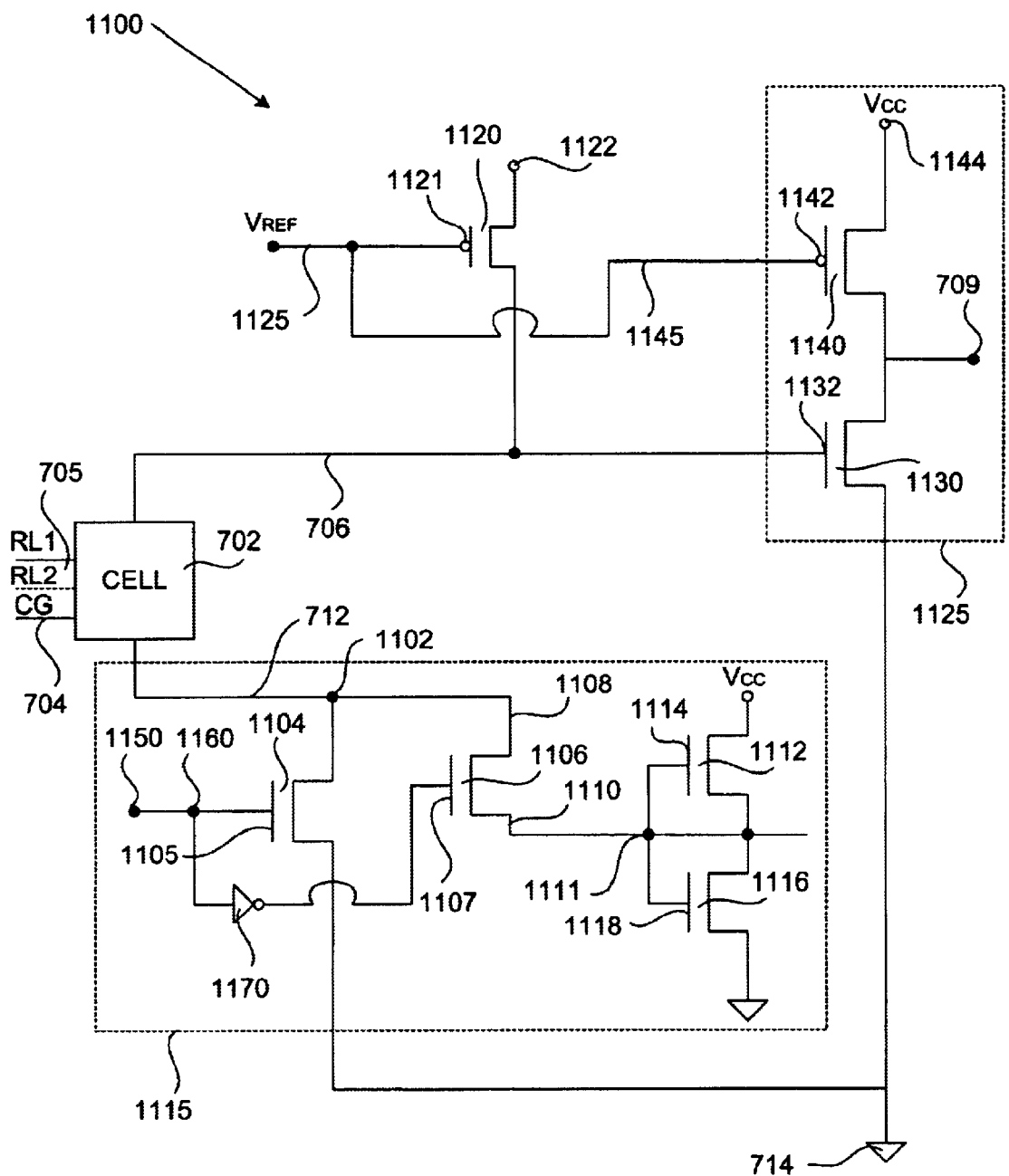
FIG. 11 is a circuit schematic diagram representing one specific circuit design according to an embodiment of the present invention in accordance with the block diagram of FIG. 10.

FIG. 11 depicts a more detailed circuit 1100 in accordance with the block diagrams of FIGS. 7 and 10. The circuit 1100 includes an EEPROM cell 702 (such as depicted in FIG. 1B). The cell 702 has a control gate 704 and one or more row lines 705. The cell 702 is connected with a drain line 706 to an n-channel transistor 1130. The drain line 706 is also connected to a transistor 1120, which has its source 1122 connected to $V_{CC}$. The gate 1121 of transistor 1120 is connected by a reference voltage line 1125 to a reference voltage between about ground and VCC which may be varied to adjust the functionality of the sense amp. This transistor 1120 and its associated features correspond to pull-up block 710 in FIGS. 7 and 10.

The sense amp, represented by block 708 in FIGS. 7 and 10, is composed of an n-channel transistor 1130 and p-channel transistor 1140, and their associated features depicted within the phantom lines 1125 in the specific embodiment depicted in FIG. 11. The gate 1142 of the p-channel transistor 1140 is connected to a reference voltage by line 1145, and the p-channel source 1144 is set to $V_{CC}$. The n-channel transistor gate 1140 is connected to the drain line 706. Output node 709 provides the sense amp output. The circuit 1100 is completed by the connection of the n-channel transistor 1130 to ground 714 and back to the cell 702 through source line 712.

As described previously, in a conventional circuit design, the n-channel transistor 1130 of the sense amp has its gate 1132 connected to the drain line 706. As the cell 702 is turned on by raising the control gate 704 voltage, the current flowing through the cell 702 to the source line 712, which is grounded, pulls drain line node 706 voltage down. As it does so, the n-channel 1130 will slowly be turned off because its gate voltage will reach the threshold voltage of that device. The voltage at output node 709 will start rising, pulled up by the p-channel transistor source 1144, as the n-channel transistor 1130 is turned off; that is, as the voltage at drain line node 706 goes down. Therefore, when the output node 709 voltage increases to the p-channel transistor source 1144 voltage, typically $V_{CC}$, it will be sensing that the cell 702 has turned on. The voltage on the control gate 704 at that moment is called the margin voltage. As previously noted, margin voltage testing may only be conducted for a single polysilicon process EEPROM cell where the margin voltage is equal to or greater than 0V.

The circuit 1100 depicted in FIG. 11 also includes circuitry, depicted within the phantom lines 1115, incorporating test mode device capable of raising the EEPROM cell's margin voltage to or above 0 V. The preferred embodiment illustrated in FIG. 11 includes a node 1102 on the source line 712 of the circuit 1100. From the node 1102, there are two alternative circuit paths available; one for operational mode, the other for test mode. In operational mode, a transistor 1104 is turned on, connecting the cell 702 to ground 714 via the source line 712, and completing the circuit in accordance with the conventional design described previously.

In test mode, transistor 1104 is turned off and transistor 1106 is turned on. Transistor 1106 has its drain 1108 connected to the source line 712 of the cell 702 and its source 1110 connected to a node 1111 at which the gate 1114 of a p-channel transistor 1112 and the gate 1118 of an n-channel transistor 1116 are connected. P-channel transistor 1112 and n-channel transistor 1116 also have their drains connected together and to node 1111. P-channel transistor 1112 has its source 1118 connected to $V_{CC}$, and n-channel transistor 1116 has its source connected to ground. As a result., this test mode device connected to the cell 702 via transistor 1106 supplies a voltage in between VCC and ground, which raises the voltage on the source line 712 of the cell 702 above its conventional grounded state. By raising the source line 712 voltage in this manner, the control gate 704 voltage must also be raised so that enough current will be created in the cell to lower the voltage on the drain line 706, in order to trip the sense amp.

A test signal controls whether the circuit 1100 operates in normal operation or test mode. The test signal is provided at node 1150 which is connected to the gate 1105 of transistor 1104. The test signal is also provided to the gate 1107 of transistor 1106 via node 1160 and through inverter 1170. As a result of this configuration, transistors 1104 and 1106 will receive opposite logic signals for a given test signals. Therefore, if transistor 1104 is turned on, transistor 1106 will be turned off, and vice versa. In the particular embodiment depicted in FIG. 11, if the test signal is a logic high the circuit will be in normal operation mode because transistor 1104 will be turned on and transistor 1106 will be turned off so that the test mode circuitry is bypassed. If, on the other hand, the test signal is a logic low, the circuit will be in test mode because transistor 1104 will be turned off and transistor 1106 will be turned on allowing a higher voltage to be supplied to the cell's source line 712.

Applications

Figure 12:
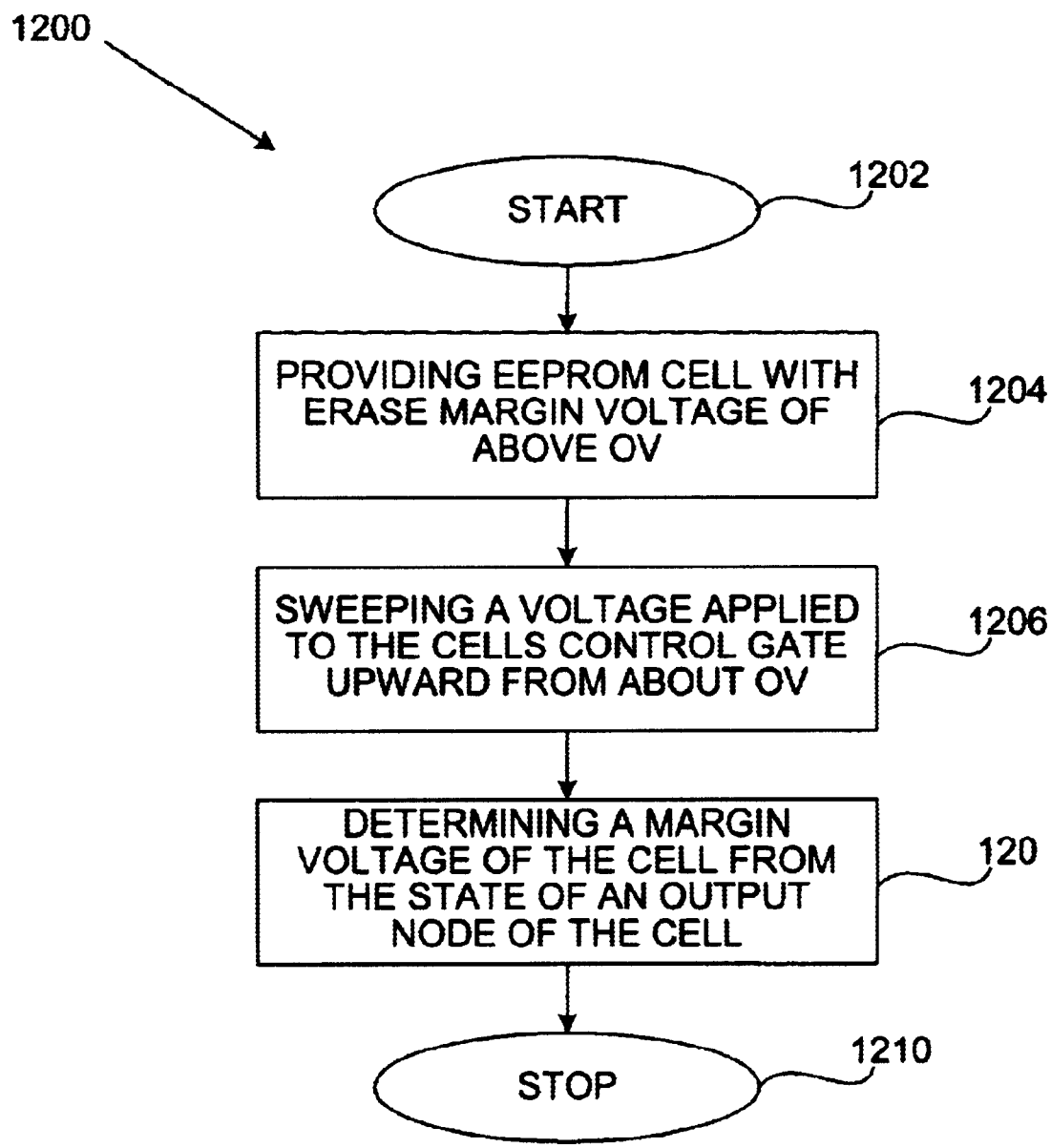
FIG. 12 is a process flow diagram of a method of margin testing a single poly EEPROM cell according to a preferred embodiment of the present invention.

The apparatuses described above are useful in a method for margin testing a single polysilicon EEPROM cell. The method of the invention is particularly useful in testing erase margin voltages, which, as discussed above, are not testable in conventional EEPROM cell margin testing methods. FIG. 12 depicts a method of margin testing a single poly EEPROM cell according to a preferred embodiment of the present invention. The process flow 1200 of FIG. 12 starts at 1202 and involves a step 1204 of providing an EEPROM cell modified in accordance with the present invention to have an erase margin voltage of above 0 V. At a step 1206, a voltage is then applied to the control gate, and swept, preferably upward from about 0 V. When the margin voltage is reached on the control gate, it is sensed by a signal received at an output node of the cell, preferably including a sense amplifier (voltage sensor). In this way, the program and erase margin voltages of the cell may be determined, at a step 1208. The process is completed at 1210.

Figure 13:
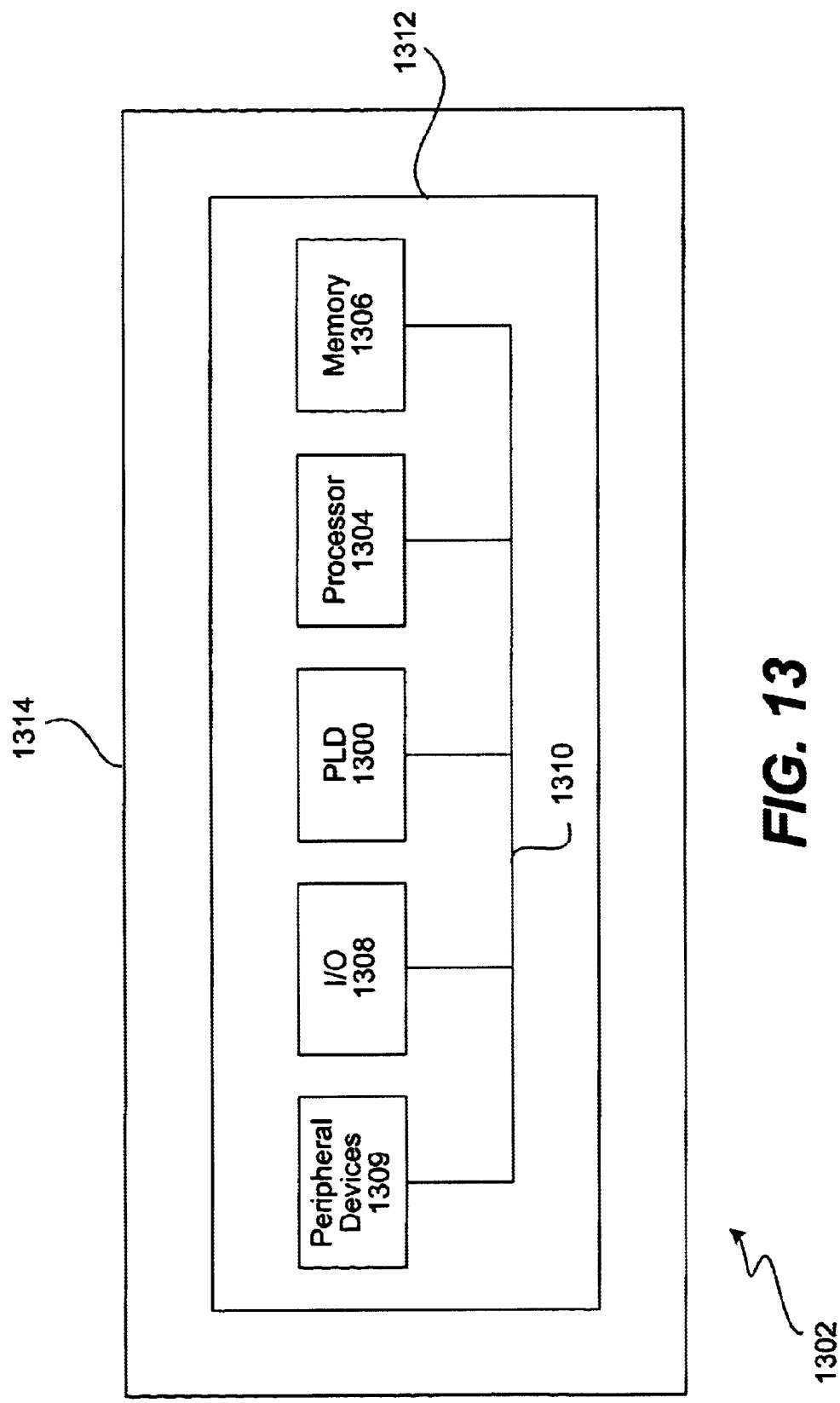
FIG. 13 illustrates a preferred implementation of an EEPROM circuit according to the present invention incorporated in a PLD in a data processing system.

The cells and circuits of the present invention may be used in a variety of applications, for instance as an alternative to the use of a conventional EEPROM device in a programmable logic device (PLD). FIG. 13 illustrates one general application of the circuits of the present invention as part of a PLD 1300 in a data processing system 1302. The data processing system 1302 may include one or more of the following components: a processor 1304; memory 1306; I/O circuitry 1308; and peripheral devices 1309. These components are coupled together by a system bus 1310 and are populated on a circuit board 1012 which is contained in an end-user system 1314.

The system 1302 can be used in a wide variety of applications, such as computer networking, data networking, instrumentation, video processing, digital processing, or any other application where the advantage of using reprogrammable logic is desirable. The PLD 1300 can be used to perform a variety of different logic functions. For example, PLD 1300 can be configured as a processor or controller that works in cooperation with processor 1304. The PLD 1300 may also be used as an arbiter for arbitrating access to a shared resource in the system 1302. In yet another example, the PLD 1300 can be configured as an interface between the processor 1304 and one of the other components in the system 1302. It should be noted that the system 1302 is only exemplary, and that the true scope and spirit of the invention should be indicated by the following claims.

Conclusion

Those of skill in the art will recognize that the described aspects of the invention may be used alone or in combination to achieve the desired result, namely an erase margin voltage at a testable level in a single poly EEPROM cell. While the present invention is applicable to EEPROM cells generally, is particularly well-adapted to use with dual row line EEPROM cells which may be biased to provide a testable erase margin voltage without increasing the stress on the cell's the tunnel window. Increased stress is undesirable for data retention and long term cell reliability. Stress-reducing biasing may be achieved by increasing the voltage on a cell's write column (on one side of the tunnel oxide) together with the voltage on the cell's control gate (on the other side of the tunnel oxide), so that the voltage across the cell's tunnel window is not increased along with the margin voltage. This biasing scheme is the subject of U.S. patent application Ser. No. 08/995,970, entitled BIASING SCHEME FOR REDUCING STRESS IN EEPROM CELLS, filed concurrently herewith and incorporated by reference in its entirety herein for all purposes.

Although specific embodiments of the present invention have been described in detail, it should be understood that the present invention may be embodied in many other specific forms without departing from the spirit or scope of the invention as recited in the claims.

What is claimed is:

1. A memory circuit, comprising:

a single polysilicon EEPROM cell having a drain line;

a margin test mode pull-up source device comprising two pull-up sources connected to said drain line, said margin test mode pull-up source device configured to produce an erase margin voltage of above 0 V in said EEPROM cell;

a sensor connected to said drain line configured to determine said erase margin voltage.

2. A memory circuit, comprising:

a single polysilicon EEPROM cell having a source line and a drain line;

a voltage control device comprising a transistor having a voltage control drain connected to the source line of the cell and a voltage control source connected to a node to which a p-channel transistor gate and an n-channel transistor gate are connected, connected to said source line, said voltage control device configured to produce an erase margin voltage of above 0 V in said EEPROM cell;

a sensor connected to said drain line configured to determine said erase margin voltage.

3. The memory circuit of claim 1, wherein said margin test mode pull-up source device comprises an inverter.

4. The memory circuit of claim 1, wherein said margin test mode pull-up source device comprises:

a p-channel transistor gate;

an inverter controlling said gate; and a source line for said gate connected to VCC.

5. The memory circuit of claim 2, wherein said voltage control device comprises a voltage control circuit configured to raise the source line bias voltage.

6. The memory circuit of claim 5, wherein said voltage control circuit is further configured to raise the control gate bias.

7. The memory circuit of claim 2, wherein said p-channel transistor and said n-channel transistor also have drains connected together and to the node.

8. The memory circuit of claim 7, wherein said p-channel transistor has a source connected to $V_{CC}$, and said n-channel transistor has a source connected to ground.

9. A memory circuit, comprising:

a single polysilicon EEPROM cell having a source line and a drain line;

a device connected to one of said drain line and said source line configured to produce an erase margin voltage of above 0 V in said EEPROM cell, the device selected from the group consisting of a margin test mode pull-up source device comprising two pull-up sources connected to said drain line and a voltage control device comprising a transistor having a voltage control drain connected to the source line of the cell and a voltage control source connected to a node to which a p-channel transistor gate and an n-channel transistor gate are connected, connected to said source line;

a sensor connected to said drain line configured to determine said erase margin voltage.

* * * * *